(12) United States Patent
Lee et al.

(10) Patent No.: US 12,058,823 B2
(45) Date of Patent: Aug. 6, 2024

(54) ELECTRONIC DEVICE INCLUDING SPEAKER MODULE

(71) Applicant: Samsung Electronics Co., Ltd., Gyeonggi-do (KR)

(72) Inventors: Seungchul Lee, Gyeonggi-do (KR); Brian Han, Gyeonggi-do (KR); Gun Lim, Gyeonggi-do (KR); Hyunje Cho, Gyeonggi-do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 319 days.

(21) Appl. No.: 17/541,373

(22) Filed: Dec. 3, 2021

(65) Prior Publication Data
US 2022/0183169 A1    Jun. 9, 2022

Related U.S. Application Data

(63) Continuation of application No. PCT/KR2021/018144, filed on Dec. 2, 2021.

(30) Foreign Application Priority Data

Dec. 4, 2020 (KR) .......................... 10-2020-0168270

(51) Int. Cl.
*H05K 5/02* (2006.01)
*H04R 1/02* (2006.01)
*H05K 5/00* (2006.01)

(52) U.S. Cl.
CPC ............ *H05K 5/0217* (2013.01); *H04R 1/02* (2013.01); *H05K 5/0017* (2013.01); *H04R 2499/11* (2013.01); *H04R 2499/15* (2013.01)

(58) Field of Classification Search
CPC .. H04R 1/02; H04R 2499/11; H04R 2499/15; H04R 1/2819; H05K 5/0217; H05K 5/0017
(Continued)

(56) References Cited

U.S. PATENT DOCUMENTS 8,351,638 B2 * 1/2013 Park ..................... H04M 1/03
381/387
10,742,784 B1 * 8/2020 Jo ...................... H04M 1/0268
(Continued)

FOREIGN PATENT DOCUMENTS

JP      2008-191398 A    8/2008
JP      2013-55702 A     3/2013
(Continued)

OTHER PUBLICATIONS

International Search Report dated Mar. 8, 2022.

*Primary Examiner* — Xu Mei
(74) *Attorney, Agent, or Firm* — Cha & Reiter, LLC

(57) ABSTRACT

An electronic device is disclosed herein, including a first housing, a second housing configured to accommodate at least a portion of the first housing, and to guide a sliding movement of the first housing, a display including a first display region disposed on the first housing, and a second display region extending from the first display region, a speaker module disposed within the second housing, and at least one roller structure configured to seal a space between the first housing and the second housing, and to guide the sliding movement of the first housing relative to the second housing.

14 Claims, 17 Drawing Sheets

(58) Field of Classification Search
USPC .......................................... 381/333, 306, 388
See application file for complete search history.

(56) References Cited

U.S. PATENT DOCUMENTS

| | | | |
|---|---|---|---|
| 11,221,650 B2* | 1/2022 | Sun | .................. G06F 1/1698 |
| 11,805,357 B2* | 10/2023 | Kim | .................. H04R 3/04 |
| 2006/0240881 A1* | 10/2006 | Cho | .................. H04M 1/03 |
| | | | 455/575.4 |
| 2010/0124955 A1* | 5/2010 | Lin | .................. H04M 1/0237 |
| | | | 455/575.4 |
| 2010/0202650 A1 | 8/2010 | Park | |
| 2012/0274570 A1* | 11/2012 | Kim | .................. G06F 1/1647 |
| | | | 361/810 |
| 2018/0014417 A1 | 1/2018 | Seo et al. | |
| 2020/0233469 A1 | 7/2020 | Won et al. | |
| 2020/0329132 A1* | 10/2020 | Jung | .................. H04M 1/0266 |
| 2021/0368251 A1* | 11/2021 | Han | .................. H04R 1/026 |

FOREIGN PATENT DOCUMENTS

| | | |
|---|---|---|
| KR | 10-2002-0011187 A | 2/2002 |
| KR | 10-2006-0103791 A | 10/2006 |
| KR | 10-2007-0045299 A | 5/2007 |
| KR | 10-2007-0104190 A | 10/2007 |
| KR | 10-2014-0051720 A | 5/2014 |
| KR | 10-2015-0008956 A | 1/2015 |
| KR | 10-2016-0011466 A | 2/2016 |
| KR | 10-1605041 B1 | 3/2016 |
| KR | 10-2018-0006533 A | 1/2018 |
| KR | 10-2020-0089781 A | 7/2020 |
| KR | 10-2020-0119003 A | 10/2020 |
| KR | 10-2020-0124989 A | 11/2020 |
| KR | 10-2022-0061784 A | 5/2022 |
| WO | 2006-011219 A1 | 2/2006 |

* cited by examiner

ELECTRONIC DEVICE INCLUDING SPEAKER MODULE

CROSS-REFERENCE TO RELATED APPLICATION(S)

This application is a continuation application, claiming priority under § 365(c), of an International application No. PCT/KR2021/018144, filed on Dec. 2, 2021, which is based on and claims the benefit of a Korean patent application number 10-2020-0168270, filed on Dec. 4, 2020, in the Korean Intellectual Property Office, the disclosures of which is incorporated by reference herein in its entirety

TECHNICAL FIELD

Certain embodiments of the disclosure relate to an electronic device including a speaker module.

BACKGROUND ART

With the development of information and communication technology and semiconductor technology, diverse functionality is now integrated into a single portable electronic device. For example, an electronic device such as a smartphone includes within itself implementation of various functions, such as entertainment (e.g., gaming), multimedia (e.g., a music/video playback), communication and security for mobile banking or the like, scheduling, e-wallet and e-payments, in addition to traditional communication functions. Further, these portable devices are increasingly miniaturized so as to be conveniently portable.

As mobile communication services are extended to multimedia service arenas, it is beneficial to increase the size of a display for portable electronic devices, for better utilization of the multimedia services, as well as providing voice call or short message service functions. However, increasing the size of the display of the electronic typically results in a trade-off with the desirable goals of miniaturizing the portable electronic devices.

SUMMARY

An electronic device (e.g., a portable terminal) may include a display having a flat surface, or a flat surface and a curved surface. An electronic device including a display may be limited in implementing a screen larger than the size of the electronic device itself, due to the fixed display structure. Accordingly, electronic devices including a foldable or rollable display are being researched to overcome this limitation.

An electronic device including a rollable display can be increased in the length or volume when disposed in an open state. When this occurs, an empty space may be defined in the electronic device when disposed in the open state.

According to certain embodiments of the disclosure, it is possible to provide an electronic device in which the empty space of the device, when disposed in the open state, may be used as a resonance space of a speaker.

According to certain embodiments of the disclosure, it is possible to provide a reflex port, the length of which changes based on the state of the electronic device.

According to certain embodiments of the disclosure, it is possible to provide an electronic device in which a signal generated by a speaker unit is adjusted based on the size of the resonance space in the electronic device, and/or the length of the reflex port.

However, the problems to be solved in the disclosure are not limited to the above-mentioned problems, and may be variously expanded without departing from the disclosure.

According to certain embodiments of the disclosure, an electronic device may include a first housing, a second housing configured to accommodate at least a portion of the first housing and to guide a sliding movement of the first housing, a display including a first display region disposed on the first housing and a second display region extending from the first display region, a speaker module disposed within the second housing, and at least one roller structure configured to seal a space between the first housing and the second housing and to guide the sliding movement of the first housing relative to the second housing.

According to various embodiments of the disclosure, an electronic device may include a first housing, a second housing configured to accommodate at least a portion of the first housing and to guide a sliding movement of the first housing, a display including a first display region disposed on the first housing and a second display region extending from the first display region, a speaker module disposed within the second housing, a guide member at least a portion of which is disposed between the first housing and the second housing, and at least one protruding structure sealing a space between the first housing and the second housing and facing the guide member.

In the electronic device according to certain embodiments of the disclosure, air leakage is reduced, by using a sealing structure in the empty space generated by the sliding motion of a housing. By using the sealed empty space as a resonance space, it is possible to improve speaker performance.

In the electronic device according to certain embodiments of the disclosure, the sound of a low-frequency band may be improved by using a reflex port, the length of which is changed based on the state of the electronic device.

In the electronic device according to certain embodiments of the disclosure, sound quality may be improved by adjusting a sound generated by the speaker module based on the size of the resonance space.

DETAILED DESCRIPTION

Figure 1:
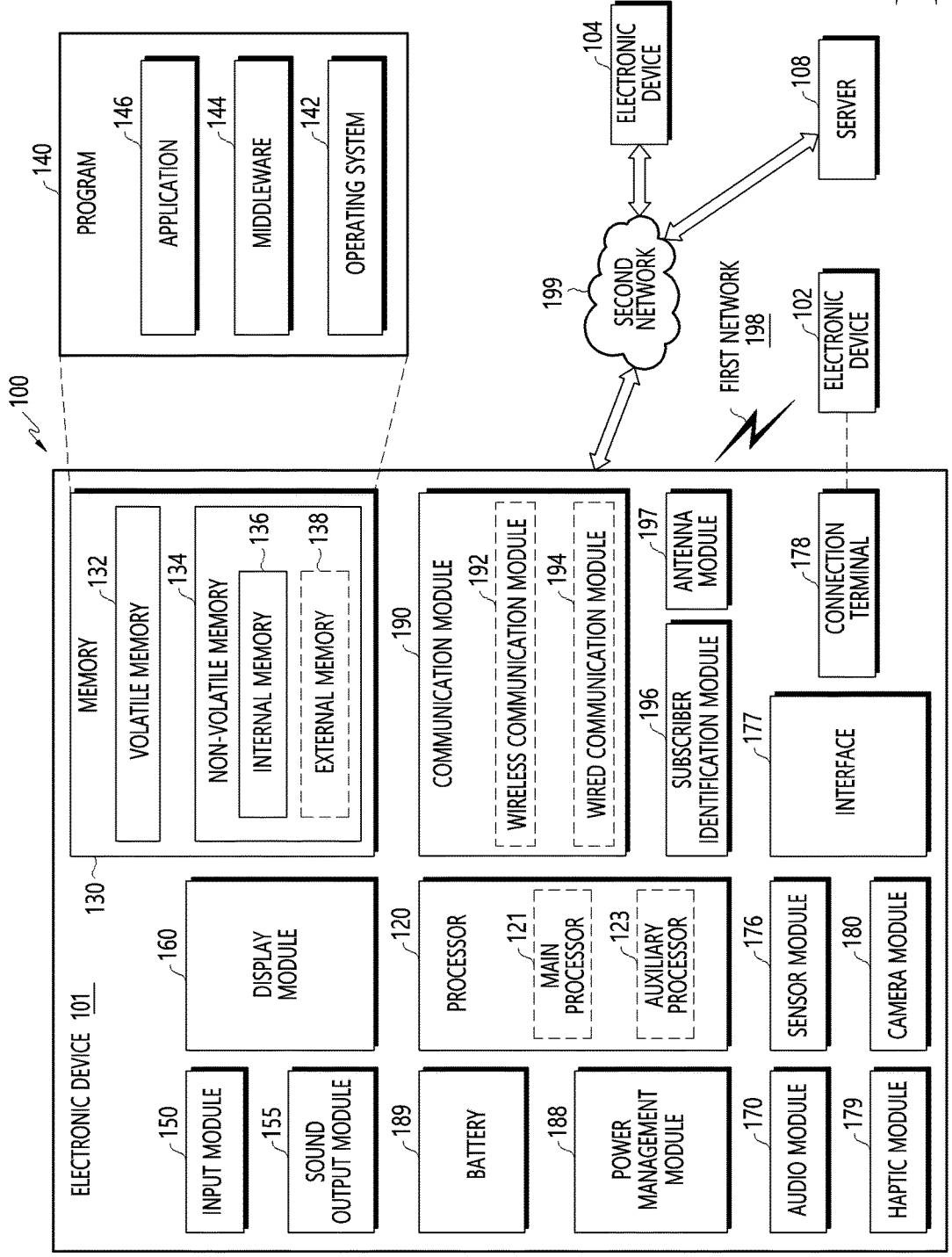
FIG. 1 is a block diagram of an example electronic device according to certain embodiments of the disclosure in a network environment.

FIG. 1 is a block diagram illustrating an electronic device 101 in a network environment 100 according to certain embodiments.

Referring to FIG. 1, the electronic device 101 in the network environment 100 may communicate with an electronic device 102 via a first network 198 (e.g., a short-range wireless communication network), or an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input module 150, a sound output module 155, a display module 160, an audio module 170, a sensor module 176, an interface 177, a connecting terminal 178, a haptic module 179, a camera module 180, a power management module 188, a battery 189, a communication module 190, a subscriber identification module (SIM) 196, or an antenna module 197. In some embodiments, at least one of the components (e.g., the connecting terminal 178) may be omitted from the electronic device 101, or one or more other components may be added in the electronic device 101. In some embodiments, some of the components (e.g., the sensor module 176, the camera module 180, or the antenna module 197) may be implemented as a single component (e.g., the display module 160).

The processor 120 may execute, for example, software (e.g., a program 140) to control at least one other component (e.g., a hardware or software component) of the electronic device 101 coupled with the processor 120, and may perform various data processing or computation. According to an embodiment, as at least part of the data processing or computation, the processor 120 may store a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), or an auxiliary processor 123 (e.g., a graphics processing unit (GPU), a neural processing unit (NPU), an image signal processor (ISP), a sensor hub processor, or a communication processor (CP)) that is operable independently from, or in conjunction with, the main processor 121. For example, when the electronic device 101 includes the main processor 121 and the auxiliary processor 123, the auxiliary processor 123 may be adapted to consume less power than the main processor 121, or to be specific to a specified function. The auxiliary processor 123 may be implemented as separate from, or as part of the main processor 121.

The auxiliary processor 123 may control, for example, at least some of functions or states related to at least one component (e.g., the display module 160, the sensor module 176, or the communication module 190) among the components of the electronic device 101, instead of the main processor 121 while the main processor 121 is in an inactive (e.g., sleep) state, or together with the main processor 121 while the main processor 121 is in an active (e.g., executing an application) state. According to an embodiment, the auxiliary processor 123 (e.g., an image signal processor or a communication processor) may be implemented as part of another component (e.g., the camera module 180 or the communication module 190) functionally related to the auxiliary processor 123. According to an embodiment, the auxiliary processor 123 (e.g., the neural processing unit) may include a hardware structure specified for artificial intelligence model processing. An artificial intelligence model may be generated by machine learning. Such learning may be performed, e.g., by the electronic device 101 where the artificial intelligence is performed or via a separate server (e.g., the server 108). Learning algorithms may include, but are not limited to, e.g., supervised learning, unsupervised learning, semi-supervised learning, or reinforcement learning. The artificial intelligence model may include a plurality of artificial neural network layers. The artificial neural network may be a deep neural network (DNN), a convolutional neural network (CNN), a recurrent neural network (RNN), a restricted Boltzmann machine (RBM), a deep belief network (DBN), a bidirectional recurrent deep neural network (BRDNN), deep Q-network or a combination of two or more thereof but is not limited thereto. The artificial intelligence model may, additionally or alternatively, include a software structure other than the hardware structure.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input module 150 may receive a command or data to be used by another component (e.g., the processor 120) of the electronic device 101, from the outside (e.g., a user) of the electronic device 101. The input module 150 may include, for example, a microphone, a mouse, a keyboard, a key (e.g., a button), or a digital pen (e.g., a stylus pen).

The sound output module 155 may output sound signals to the outside of the electronic device 101. The sound output module 155 may include, for example, a speaker or a receiver. The speaker may be used for general purposes, such as playing multimedia or playing record. The receiver may be used for receiving incoming calls. According to an embodiment, the receiver may be implemented as separate from, or as part of the speaker.

The display module 160 may visually provide information to the outside (e.g., a user) of the electronic device 101. The display module 160 may include, for example, a display, a hologram device, or a projector and control circuitry to control a corresponding one of the display, hologram device, and projector. According to an embodiment, the display module 160 may include a touch sensor adapted to detect a touch, or a pressure sensor adapted to measure the intensity of force incurred by the touch.

The audio module 170 may convert a sound into an electrical signal and vice versa. According to an embodiment, the audio module 170 may obtain the sound via the input module 150, or output the sound via the sound output module 155 or an external electronic device (e.g., an electronic device 102 (e.g., a speaker or a headphone)) directly or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, an HDMI connector, a USB connector, an SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to an embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, wireless-fidelity (Wi-Fi) direct, or infrared data association (IrDA)) or the second network 199 (e.g., a long-range communication network, such as a legacy cellular network, a 5G network, a next-generation communication network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify or authenticate the electronic device 101 in a communication network, such as the first network 198 or the second network 199, using subscriber information (e.g., international mobile subscriber identity (IMSI)) stored in the subscriber identification module 196.

The wireless communication module 192 may support a 5G network, after a 4G network, and next-generation communication technology, e.g., new radio (NR) access technology. The NR access technology may support enhanced mobile broadband (eMBB), massive machine type communications (mMTC), or ultra-reliable and low-latency communications (URLLC). The wireless communication module 192 may support a high-frequency band (e.g., the mmWave band) to achieve, e.g., a high data transmission rate. The wireless communication module 192 may support various technologies for securing performance on a high-frequency band, such as, e.g., beamforming, massive multiple-input and multiple-output (massive MIMO), full dimensional MIMO (FD-MIMO), array antenna, analog beam-forming, or large scale antenna. The wireless communication module 192 may support various requirements specified in the electronic device 101, an external electronic device (e.g., the electronic device 104), or a network system (e.g., the second network 199). According to an embodiment, the wireless communication module 192 may support a peak data rate (e.g., 20 Gbps or more) for implementing eMBB, loss coverage (e.g., 164 dB or less) for implementing mMTC, or U-plane latency (e.g., 0.5 ms or less for each of downlink (DL) and uplink (UL), or a round trip of 1 ms or less) for implementing URLLC.

The antenna module 197 may transmit or receive a signal or power to or from the outside (e.g., the external electronic device) of the electronic device 101. According to an embodiment, the antenna module 197 may include an antenna including a radiating element implemented by a conductive material or a conductive pattern formed in or on a substrate (e.g., a printed circuit board (PCB)). According to an embodiment, the antenna module 197 may include a plurality of antennas (e.g., array antennas). In such a case, at least one antenna appropriate for a communication scheme used in the communication network, such as the first network 198 or the second network 199, may be selected, for example, by the communication module 190 from the plurality of antennas. The signal or the power may then be transmitted or received between the communication module 190 and the external electronic device via the selected at least one antenna. According to an embodiment, another component (e.g., a radio frequency integrated circuit (RFIC)) other than the radiating element may be additionally formed as part of the antenna module 197.

According to certain embodiments, the antenna module 197 may form a mmWave antenna module. According to an embodiment, the mmWave antenna module may include a printed circuit board, an RFIC disposed on a first surface (e.g., the bottom surface) of the printed circuit board, or adjacent to the first surface and capable of supporting a designated high-frequency band (e.g., the mmWave band), and a plurality of antennas (e.g., array antennas) disposed on a second surface (e.g., the top or a side surface) of the printed circuit board, or adjacent to the second surface and capable of transmitting or receiving signals of the designated high-frequency band.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the electronic devices 102 or 104 may be a device of a same type as, or a different type, from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, mobile edge computing (MEC), or client-server computing technology may be used, for example. The electronic device 101 may provide ultra low-latency services using, e.g., distributed computing or mobile edge computing. In another embodiment, the external electronic device 104 may include an internet-of-things (IoT) device. The server 108 may be an intelligent server using machine learning and/or a neural network. According to an embodiment, the external electronic device 104 or the server 108 may be included in the second network 199. The electronic device 101 may be applied to intelligent services (e.g., smart home, smart city, smart car, or healthcare) based on 5G communication technology or IoT-related technology.

The electronic device according to certain embodiments may be one of various types of electronic devices. The electronic devices may include, for example, a portable communication device (e.g., a smartphone), a computer device, a portable multimedia device, a portable medical device, a camera, a wearable device, or a home appliance. According to an embodiment of the disclosure, the electronic devices are not limited to those described above.

It should be appreciated that certain embodiments of the disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wiredly), wirelessly, or via a third element.

As used in connection with certain embodiments of the disclosure, the term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

According to certain embodiments, each component (e.g., a module or a program) of the above-described components may include a single entity or multiple entities, and some of the multiple entities may be separately disposed in different components. According to certain embodiments, one or more of the above-described components or operations may be omitted, or one or more other components or operations may be added. Alternatively or additionally, a plurality of components (e.g., modules or programs) may be integrated into a single component. In such a case, the integrated component may still perform one or more functions of each of the plurality of components in the same or similar manner as they are performed by a corresponding one of the plurality of components before the integration. According to certain embodiments, operations performed by the module, the program, or another component may be carried out sequentially, in parallel, repeatedly, or heuristically, or one or more of the operations may be executed in a different order or omitted, or one or more other operations may be added.

Figure 2:
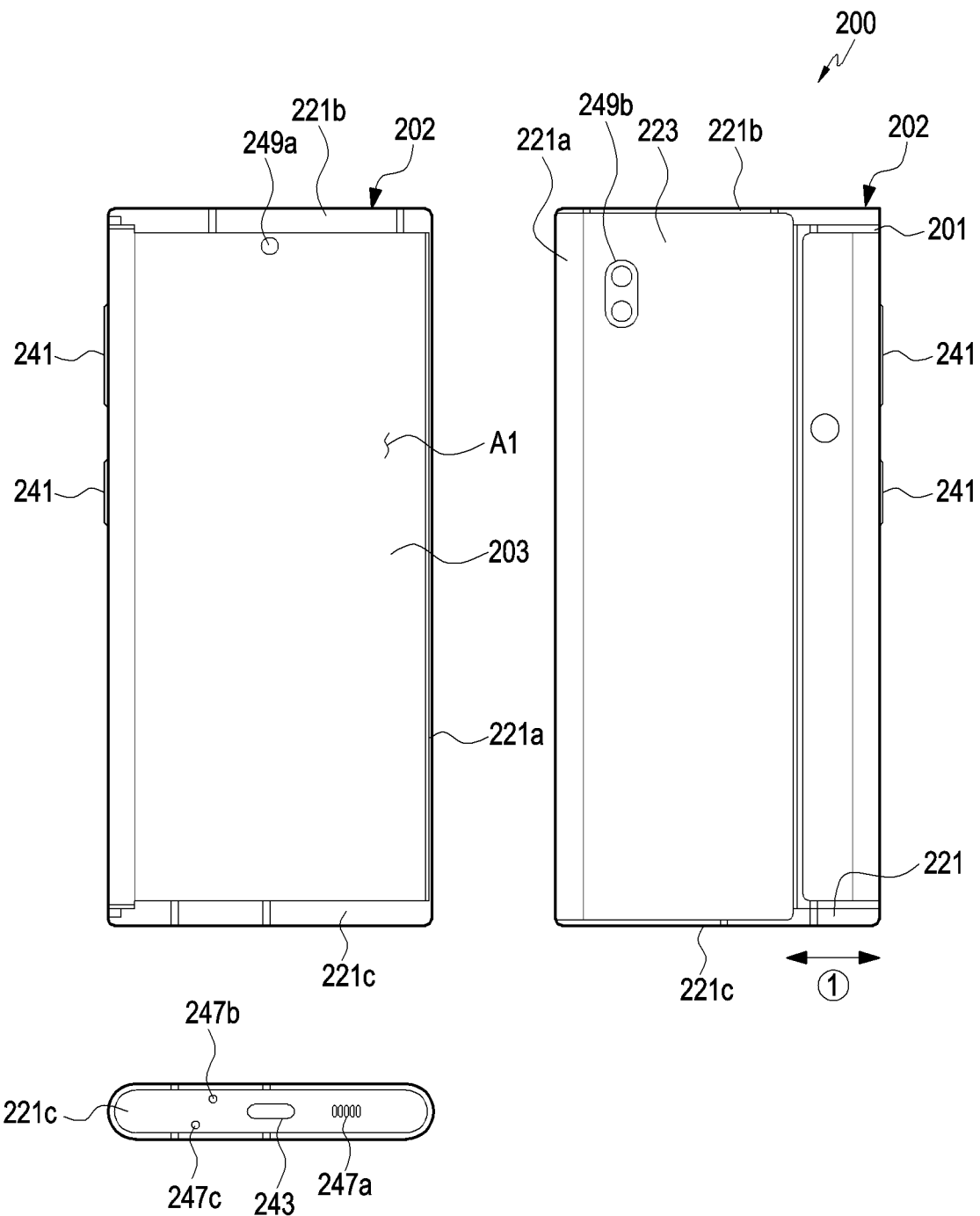
FIG. 2 is a view illustrating the example state in which a second display region of a display is accommodated in a second housing, according to certain embodiments of the disclosure.
Figure 3:
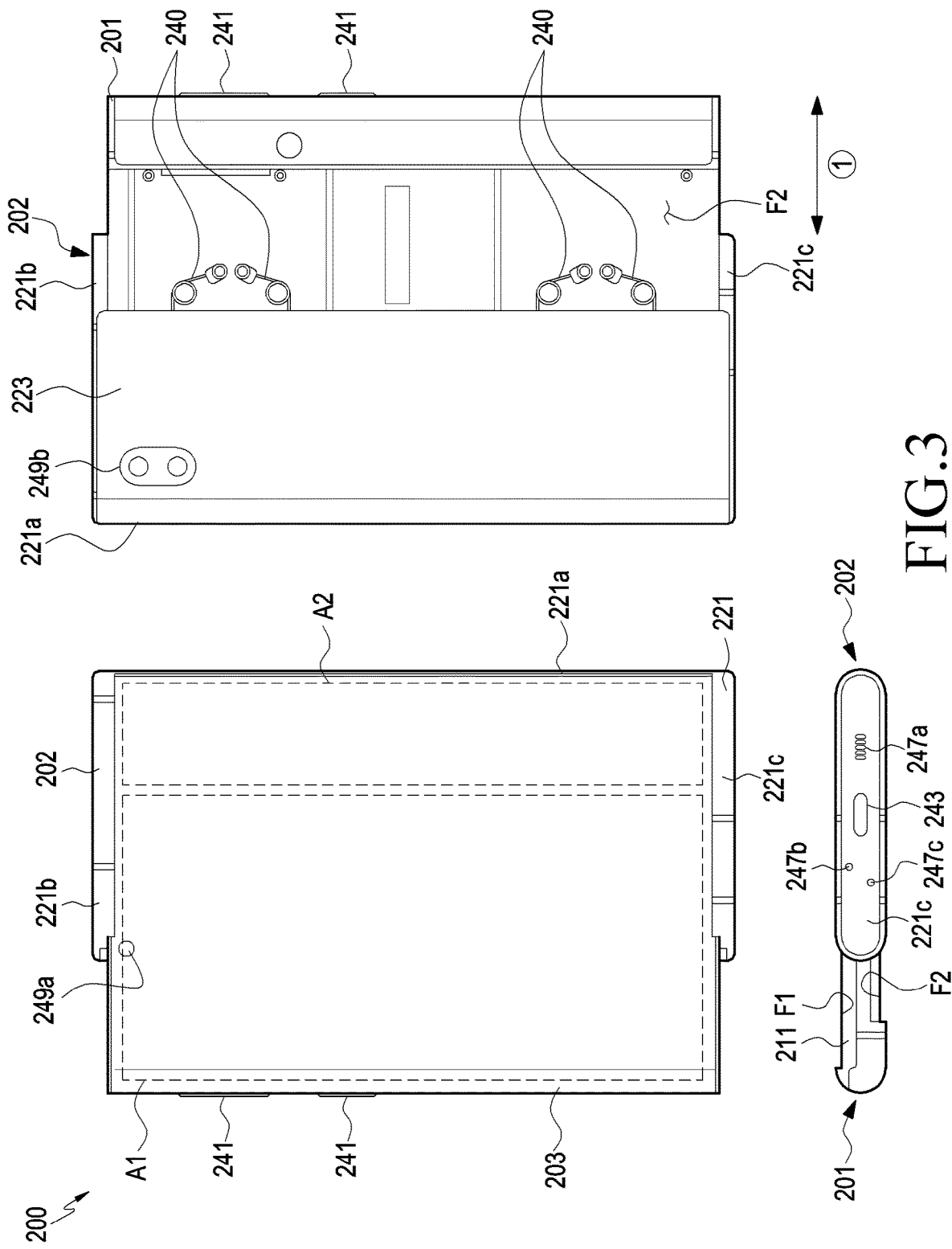
FIG. 3 is a view illustrating the example state in which the second display region of the display is extended as to be visible from an exterior of the second housing, according to certain embodiments of the disclosure.

FIG. 2 is a view illustrating the state in which a second display region of a display is stowed (e.g., "accommodated") in a second housing, according to certain embodiments of the disclosure. FIG. 3 is a view illustrating the state in which the second display region of the display is extended as to be visible from an exterior of the second housing, according to certain embodiments of the disclosure.

The state illustrated in FIG. 2 may be defined as a state in which the first housing 201 is stowed within the second housing 202 (e.g., a "closed" state), and the state illustrated in FIG. 3 may be defined as the state in which the first structure 201 is extended out of the second housing 202 (e.g., an "open" state). According to an embodiment, the "closed state" or the "open state" may be defined as a state in which the electronic device is closed or a state in which the electronic device is open.

Referring to FIGS. 2 and 3, an electronic device 200 may include housings 201 and 202. The housings 201 and 202 may include a second housing 202 and a first housing 201 configured to be movable relative to the second housing 202. In some embodiments, the electronic device 200 may include a structure in which the second housing 202 is configured to be slidable with respect to the first housing 201. According to an embodiment, the first housing 201 may be configured to be reciprocable by a predetermined distance in the illustrated direction (e.g., the direction indicated by arrow ①) relative to the second housing 202. The configuration of the electronic device 200 of FIGS. 2 and 3 may be the same in whole or in part as that of the electronic device 101 of FIG. 1.

According to certain embodiments, the first housing 201 may be referred to as, for example, a first structure, a slide unit, or a slide housing, and may be configured to be reciprocable with respect to the second housing 202. According to an embodiment, the first housing 201 may accommodate various electrical and electronic components such as a circuit board and a battery. According to an embodiment, the second housing 202 may be referred to as, for example, a second structure, a main part, or a main housing. A portion of the display 203 (e.g., a first display region A1) may be disposed on the first housing 201.

According to an embodiment, when the first housing 201 moves (e.g., slides) relative to the second housing 202, another portion of the display 203 (e.g., a second display region A2) may be stowed within the second housing 202, (e.g., a slide-in operation) or extended as to be visible to an exterior of the second housing 202 (e.g., a slide-out operation).

According to certain embodiments, the first housing 201 may include a first support member 211 (e.g., a slide plate). The first support member 211 may include a first surface (e.g., the first surface F1 in FIG. 4) providing at least a portion of the first support member 211 and a second surface F2 facing away from the first surface F1. According to an embodiment, the first support member 211 may support at least a portion of the display 203 (e.g., the first display region A1).

According to certain embodiments, the second housing 202 may include a second support member 221 (e.g., a main case). The second support member 221 may accommodate the first support member 211 of the first housing 201. For example, the second support member 221 may include a second side member 221b, a third side member 221c substantially parallel to the second side member 221b, and a first side member 221a perpendicular to the second side member 221b and the third side member 221c. According to an embodiment, the second support member 221 may have a shape that opens at one side (e.g., the front surface) to accommodate (or surround) at least a portion of the first housing 201. For example, the first housing 201 is accommodated in the second housing 202 in a state of being at least partially surrounded and is slidable in a direction parallel to the first surface F1 or the second surface F2 (e.g., the direction indicated by arrow ①) while guided by the second housing 202. According to an embodiment, the second support member 221, the first side member 221a, the second side member 221b, and/or the third side member 221c may be integrated with each other. According to another embodiment, the second support member 221, the first side member 221a, the second side member 221b, and/or the third side member 221c may be configured as separate housings to be coupled to or assembled with each other.

According to certain embodiments, the second housing 202 may cover at least a portion of the display 203. For example, at least a portion of the display 203 may be stowed within the second housing 202, and a portion of the second support member 221 (e.g., the first side member 221a) may cover a portion of the display 203 stowed within the second housing 202.

According to certain embodiments, the electronic device 200 may include a display 203, key input devices 241, a connector hole 243, audio modules 247a and 247b, or camera modules 249a and 249b. Although not illustrated, the electronic device 200 may further include an indicator (e.g., an LED device) or various sensor modules. The configurations of the display 203, the audio modules 247a and 247b, and the camera modules 249a and 249b of FIGS. 2 and 3 may be the same in whole or in part as those of the display module 160, the audio module 170, and the camera module 180 of FIG. 1.

According to certain embodiments, the display 203 may include a first display region A1 and a second display region A2. According to an embodiment, the first display region A1 may be disposed on the first housing 201. For example, the first display region A1 may extend substantially across at least a portion of the first surface F1 and may be disposed on the first surface F1. The second display region A2 may extend from the first display region A1, and according to the sliding movement of the first housing 201, the second display region A2 may be inserted into or stowed within the second housing 202, or may be extended as to be visible from an exterior of the second housing 202.

According to certain embodiments, the second display region A2 may be movable, with the corresponding movement being substantially guided by a roller (e.g., the roller 250 in FIG. 4) mounted on the first housing 201 to be stowed within the second housing, or in a space defined between the first housing 201 and the second housing 202 or to be extended as to be visible from an exterior environment. According to an embodiment, the second display region A2 may be moved based on the sliding movement of the first housing 201 in the first direction (e.g., the direction indicated by arrow ①). For example, while the first housing 201 slides, a portion of the second display region A2 may be deformed into a curved shape at a position corresponding to the roller 250.

According to certain embodiments, when viewed from above the first support member 211 (e.g., the slide plate), if the first housing 201 is moved, transitioning from the closed state to the open state, the second display region A2 may then define a substantially flat surface with the first display region A1 while being gradually extended as to be visible from an exterior of the second housing 202. The display 203 may be coupled to or disposed adjacent to a touch detection circuit, a pressure sensor capable of measuring touch intensity (pressure), and/or a digitizer configured to detect a magnetic-field-type stylus pen. In an embodiment, the second display region A2 may remain at least partially disposed inside the second housing 202, and even in the state (e.g., the closed state) illustrated in FIG. 2, a portion of the second display region A2 may be extended as to be visible from an exterior. According to an embodiment, irrespective of the closed state or the open state, a portion of the exposed second display region A2 may be located on the roller (e.g., the roller 250 in FIG. 4), and at a position corresponding to the roller 250, a portion of the second display region A2 may maintain the curved shape.

According to certain embodiments, the electronic device 200 may include at least one hinge structure 240. According to an embodiment, the hinge structure 240 may operatively connect the first housing 201 and the second housing 202 to one another. For example, the hinge structure 240 may be connected to the first support member 211 and the second support member 221. According to an embodiment, the hinge structure 240 may transmit a driving force for guiding the sliding movement of the first housing 201 to the first housing 201. For example, the hinge structure 240 may include an elastic material (e.g., a spring), and may provide an elastic force in the first direction (e.g., the direction ① in FIG. 3) based on the sliding movement of the first housing 201.

According to certain embodiments, the key input device 241 may be located in a region of the first housing 201. Depending on the external appearance and use state, the electronic device 200 may be designed such that the illustrated key input devices 241 are omitted or an additional key input device(s) is(are) included. According to an embodiment, the electronic device 200 may include a key input device (not illustrated), such as a home key button or a touch pad disposed around the home key button. According to another embodiment, at least some of the key input devices 241 may be disposed on the first side member 221a, the second side member 221b and/or the third side member 221c of the second housing 202.

According to certain embodiments, the connector hole 243 may be omitted depending on an embodiment. In embodiments including a connector hole 243, the connector hole 243 may be configured to receive a connector (e.g., a USB connector) for transmitting and receiving power and/or data to and from an external electronic device. Although not illustrated, the electronic device 200 may include a plurality of connector holes 243, and some of the connector holes 243 may function as connector holes for transmitting and receiving audio signals to and from an external electronic device. In the illustrated embodiment, the connector hole 243 is disposed in the third side member 221c, but the disclosure is not limited thereto. The connector hole 243 or a connector hole (not illustrated) may be disposed in the first side member 221a or the second side member 221b.

According to certain embodiments, the audio modules 247a and 247b may include at least one speaker hole, at least one microphone hole, or at least one duct 247c. One speaker hole may be provided as a receiver hole for a voice call, and another one may be provided as an external speaker hole. The electronic device 200 may include a microphone configured to acquire sound, and the microphone may acquire sound outside the electronic device 200 through the microphone hole. The electronic device 200 may guide a part of the energy of low-frequency band generated by the speaker (e.g., the speaker in FIG. 1) to the outside of the electronic device 200 using the duct 247c (e.g., hole 247c). According to an embodiment, the electronic device 200 may include a plurality of microphones to detect the direction of sound. According to an embodiment, the electronic device 200 may include an audio module in which the speaker hole and the microphone hole are implemented as a single hole, or a speaker in which the speaker hole is excluded (e.g., a piezo speaker).

According to certain embodiments, the camera modules 249a and 249b may include a first camera module 249a and a second camera module 249b. The second camera module 249b may be located in the first housing 201 and may photograph a subject in a direction opposite to the first display region A1 of the display 203. The electronic device 200 may include a plurality of camera modules. For example, the electronic device 200 may include at least one of a wide-angle camera, a telephoto camera, and a close-up camera. According to an embodiment, the electronic device 200 may include an infrared projector and/or an infrared receiver to measure the distance to the subject. The camera modules 249a and 249b may include one or more lenses, an image sensor, and/or an image signal processor. The electronic device 200 may further include another camera module (the first camera module 249a) (e.g., a front camera) for photographing a subject in a direction different from that of the second camera module 249b. For example, the first camera module 249a may be disposed around the first display region A1 or in a region overlapping the display 203, and when disposed in the region overlapping the display 203, the first camera module 249a may photograph a subject through the display 203.

According to certain embodiments, an indicator (not illustrated) of the electronic device 200 may be disposed on the first housing 201 or the second housing 202, and may provide state information of the electronic device 200 as a visual signal by including a light-emitting diode. A sensor module (not illustrated) of the electronic device 200 may generate an electrical signal or a data value corresponding to an internal operating state of the electronic device 200 or an external environmental state. The sensor module may include, for example, a proximity sensor, a fingerprint sensor, or a biometric sensor (e.g., an iris/face recognition sensor or an HRM sensor). In another embodiment, the sensor module may further include at least one of, for example, a gesture sensor, a gyro sensor, an atmospheric pressure sensor, a magnetic sensor, an acceleration sensor, a grip sensor, a color sensor, an infrared (IR) sensor, a temperature sensor, a humidity sensor, or an illuminance sensor.

Figure 4:
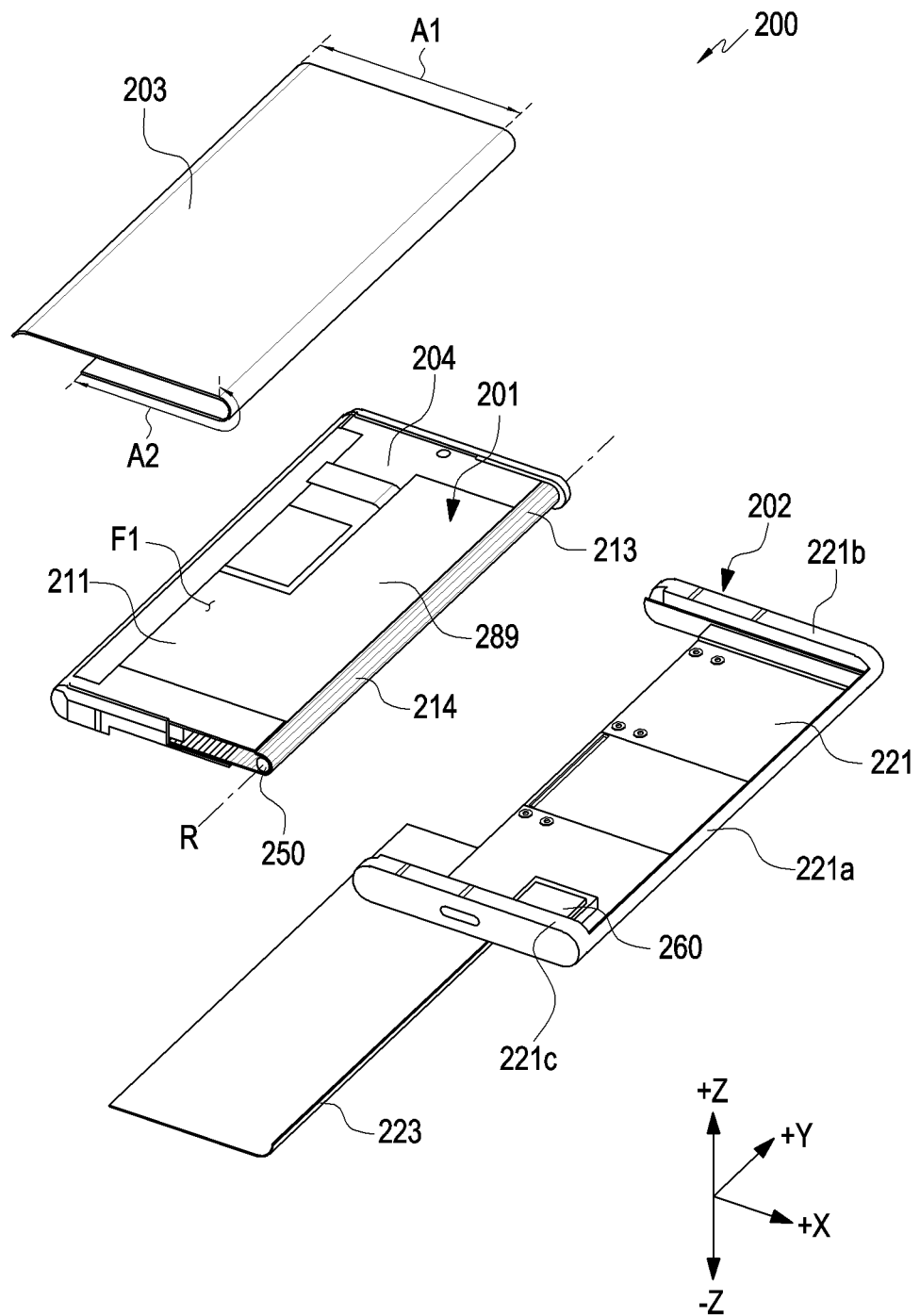
FIG. 4 is an exploded perspective view of an example electronic device according to certain embodiments of the disclosure.

FIG. 4 is an exploded perspective view of an electronic device according to certain embodiments of the disclosure.

Referring to FIG. 4, the electronic device 200 may include a first housing 201, a second housing 202, and a display 203 (e.g., a flexible display, a foldable display, or a rollable display), a roller 250, and an articulated hinge structure 213. A portion of the display 203 (e.g., the second display region A2) may be stowed within the electronic device 200 while guided by the roller 250. The configurations of the first housing 201, the second housing 202, and the display 203 of FIG. 4 may be the same in whole or in part as those of the first housing 201, the second housing 202, and the display 203 of FIGS. 2 and 3.

According to certain embodiments, the first housing 201 may include a first support member 211. The first support member 211 may be mounted on the second housing 202 and may be linearly reciprocable in one direction (e.g., the direction indicated by arrow ① in FIG. 1) while guided by the second housing 202. According to an embodiment, the first support member 211 may include a first surface F1, and the first display region A1 of the display 203 may be substantially mounted on the first surface F1 while maintained in a flat form. According to an embodiment, the first support member 211 may be formed of a metal material and/or a non-metal (e.g., a polymer) material. According to an embodiment, the first support member 211 may receive components of the electronic device 200 (e.g., the battery 289 (e.g., the battery 189 of FIG. 1) and the circuit board 204).

According to certain embodiments, the articulated hinge structure 213 may be operatively connected to the display 203. According to an embodiment, as the first housing 201 slides, the articulated hinge structure 213 may move relative to the second housing 202. The articulated hinge structure 213 may be substantially disposed within the second housing 202 in the closed state (e.g., FIG. 2). According to an embodiment, at least a portion of the articulated hinge structure 213 may be disposed between the first support member 211 of the first housing 201 and the second support member 221 and/or the first side member 221a of the second housing 202 and movement thereof may correspond with the roller 250.

According to certain embodiments, the articulated hinge structure 213 may include a plurality of bars or rods 214. The plurality of rods 214 may extend linearly in parallel to the rotation axis R of the roller 250, and may be arranged in a direction perpendicular to the rotation axis R (e.g., the direction in which the first housing 201 slides).

According to certain embodiments, each rod 214 may be aligned toother adjacent rods 214, while maintaining the parallel state parallel with other adjacent rods 214. According to an embodiment, as the first housing 201 slides, the plurality of rods 214 may be arranged to define a curved shape or may be arranged to define a flat shape. For example, as the first housing 201 slides, a portion of the articulated hinge structure 213 facing the roller 250 may define a curved surface, and another portion of the articulated hinge structure 213 that does not face the roller may define a flat surface. According to an embodiment, the second display region A2 of the display 203 may be mounted or supported on the articulated hinge structure 213, and in the open state (e.g., FIG. 3), at least a portion of the second display region A2 may be extended as to be visible from an exterior of the second housing 202 together with the first display region A1. In the state in which the second display region A2 is extended as to be visible from an exterior of the second housing 202, the articulated hinge structure 213 may support or maintain the second display region A2 in the flat state by defining a substantially flat surface. According to an embodiment, the articulated hinge structure 213 may be replaced with a bendable integrated support member (not illustrated).

According to certain embodiments, the second housing 202 may include a rear plate 223. According to an embodiment, the rear plate 223 may substantially define at least a portion of the exterior of the second housing 202 or the electronic device 200. For example, the rear plate 223 may be coupled to the outer surface of the second support member 221. According to an embodiment, the rear plate 223 may be integrated with the second support member 221.

According to an embodiment, the rear plate 223 may provide a decorative aesthetic effect for the exterior of the electronic device 200. The second support member 221 may be manufactured using at least one of a metal or a polymer, and the rear plate 223 may be manufactured using at least one of a metal, glass, a synthetic resin, or ceramic. According to an embodiment, the second support member 221 and/or the rear plate 223 may be formed of a material that at least partially transmits light (e.g., an auxiliary display region). For example, when in the state in which a portion of the display 203 (e.g., the second display region A2) is disposed inside the electronic device 200, the electronic device 200 may output visual information using the second display region A2. The auxiliary display region may be a portion of the second support member 221 and/or the rear plate 223 in which the display 203 accommodated inside the second housing 202 is located.

According to certain embodiments, the roller 250 may guide the rotation of the second display region A2 while rotating about the rotation axis R. According to an embodiment, the roller 250 may be disposed within the second housing 202. For example, the roller 250 may be rotatably mounted at one edge of the second support member 221 of the second housing 202. According to an embodiment, the roller 250 may be disposed within the first housing 201. For example, the roller 250 may be rotatably mounted at one edge of the first support member 211 of the first housing 201.

According to certain embodiments, the electronic device 200 may include a speaker module 260. The speaker module 260 may be disposed within the second housing 202. The configuration of the speaker module 260 of FIG. 4 may be the same in whole or in part as that of the audio module 170 of FIG. 1.

Figure 5A:
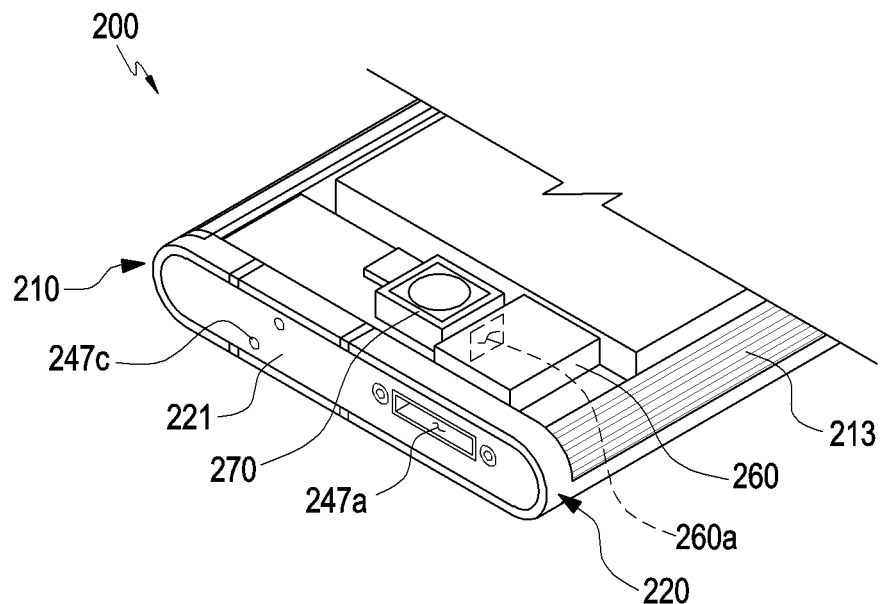
FIG. 5A is an internal perspective view of an example electronic device according to certain embodiments of the disclosure in the closed state.
Figure 5B:
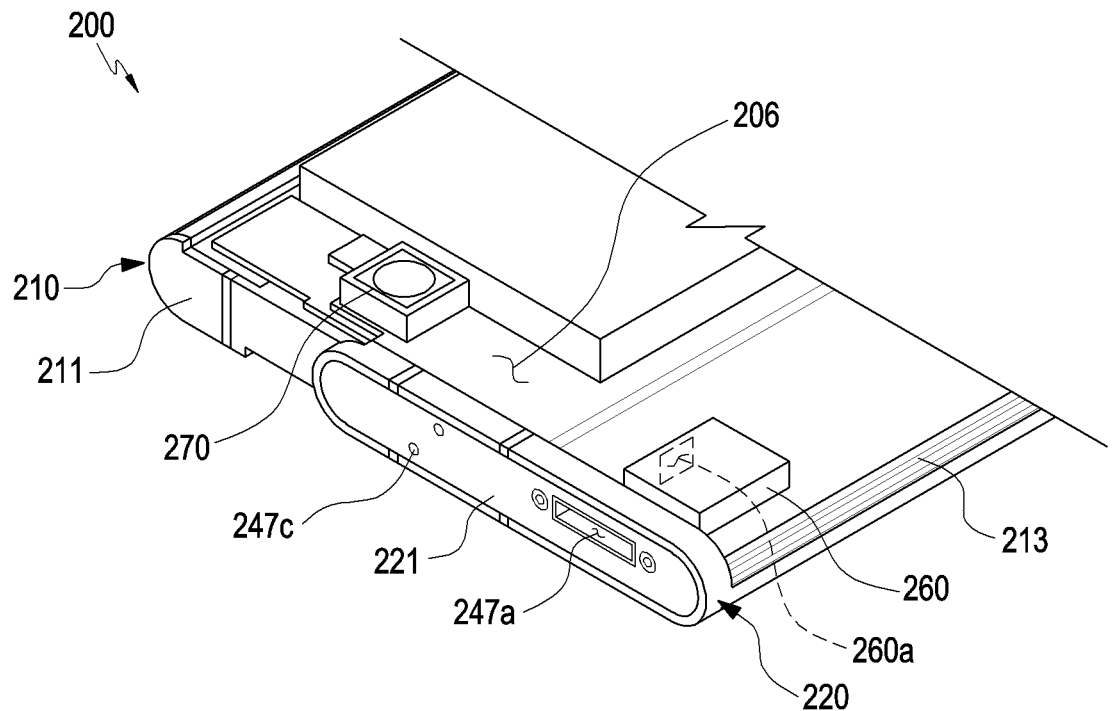
FIG. 5B is an internal perspective view of an electronic device according to certain embodiments of the disclosure in the open state.

FIG. 5A is an internal perspective view of an electronic device according to certain embodiments of the disclosure in the closed state, and FIG. 5B is an internal perspective view of an electronic device according to certain embodiments of the disclosure in the open state.

Referring to FIGS. 5A and 5B, the first housing 210 may be slidable relative to the second housing 220. The configurations of the electronic device 200, the first housing 210, the first support member 211, the articulated hinge structure 213, the second housing 220, the second support member 221, and the speaker module 260 of FIGS. 5A and 5B may be the same in whole or in part as those of the electronic device 200, the first housing 201, the first support member 211, the articulated hinge structure 213, the second housing 202, the second support member 221, and the speaker module 260 of FIG. 4.

According to certain embodiments, the electronic device 200 may include a speaker module 260. The speaker module 260 may be disposed within the second housing 220. According to an embodiment, the speaker module 260 may be disposed adjacent to the speaker hole in the second support member 221 and may transmit vibration and/or sound to the outside of the electronic device 200 through the speaker hole provided in the second support member 221 of the second housing 220.

According to certain embodiments, the first housing 210 may be slidable relative to the second housing 220. Since the first housing 210 slides relative to the second housing 220, a resonance space 206 may be created within the electronic device 200. According to an embodiment, the size of the resonance space 206 may change based on the sliding movement of the first housing 210. For example, the size of the resonance space 206 in the open state (e.g., FIG. 5B) of the electronic device 200 may be larger than the resonance space (not illustrated) in the state in which the electronic device 200 is closed (e.g., FIG. 5A). According to an embodiment, the resonance space 206 may include a space surrounded by components of the first housing 210 (e.g., the first support member 211), components of the second housing 220 (e.g., the second support member 221 and/or the side wall 260*a* of the speaker module 260), and the components that seal the space between the first housing 210 and the second housing 220 (e.g., the roller structure 350 in FIG. 6, the protruding structure in FIG. 9, and/or the sealing member 550 in FIG. 11A).

According to certain embodiments, based on the size (e.g., the volume) of the resonance space 206, the performance in the low-frequency band (e.g., a 200 to 800 Hz band) of the speaker module 260 can be improved. For example, the volume of sound of the low-frequency band may increase based on the size of the resonance space 206.

According to certain embodiments, the second support member 221 may include a through hole 247*c* spaced apart from the speaker hole. The through hole 247*c* has a bass reflex or duct structure, and may provide a path through which at least a part of vibration generated by the speaker module 260 passes. According to an embodiment, the speaker module 260 is a bass reflex-type speaker, and at least a part of the vibration generated by the speaker module 260 can be transmitted to the outside of the electronic device 200 through the resonance space 206 and the through hole 247*c*.

According to certain embodiments, the electronic device 200 may include a motor module 270. According to an embodiment, the motor module 270 may generate a rotational force for the sliding motion of the first housing 210 using power received from a battery (e.g., the battery 289 in FIG. 4). According to an embodiment, the motor module 270 may be disposed inside the first support member 211 of the first housing 210 and may be connected to the second support member 221 of the second housing 220 via a gear structure (not illustrated). The first housing 210 is slidable relative to the second housing 220 based on the rotational force generated by the motor module 270. According to another embodiment, the motor module 270 may be disposed inside the second support member 221 of the second housing 220, and may be connected to the articulated hinge structure 213 or the first support member 211. According to an embodiment, the motor module 270 may be excluded. For example, the electronic device 200 may be opened or closed by a force provided by the user.

Figure 6:
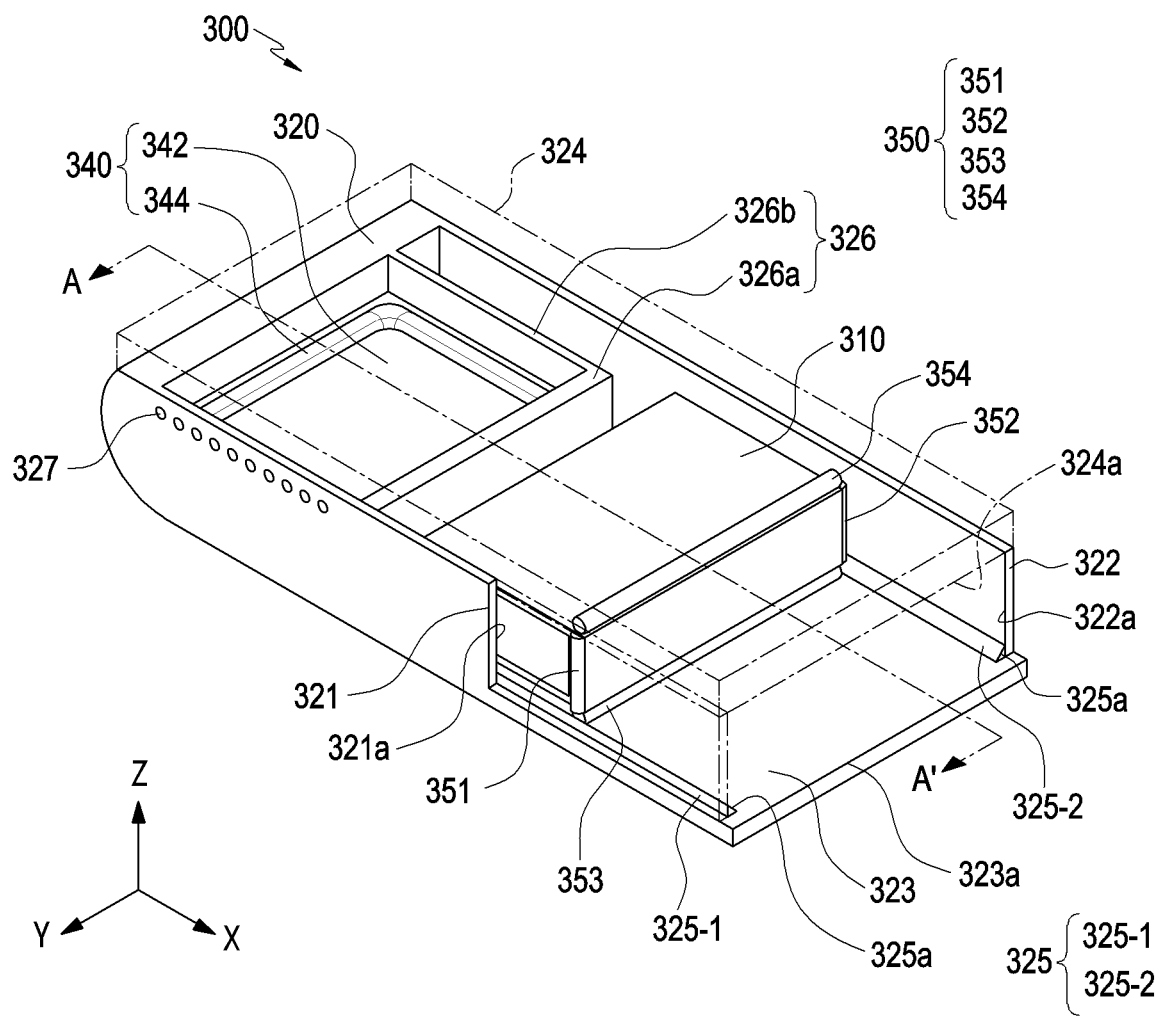
FIG. 6 is an internal perspective view of an example electronic device including a roller structure, according to certain embodiments of the disclosure.
Figure 7:
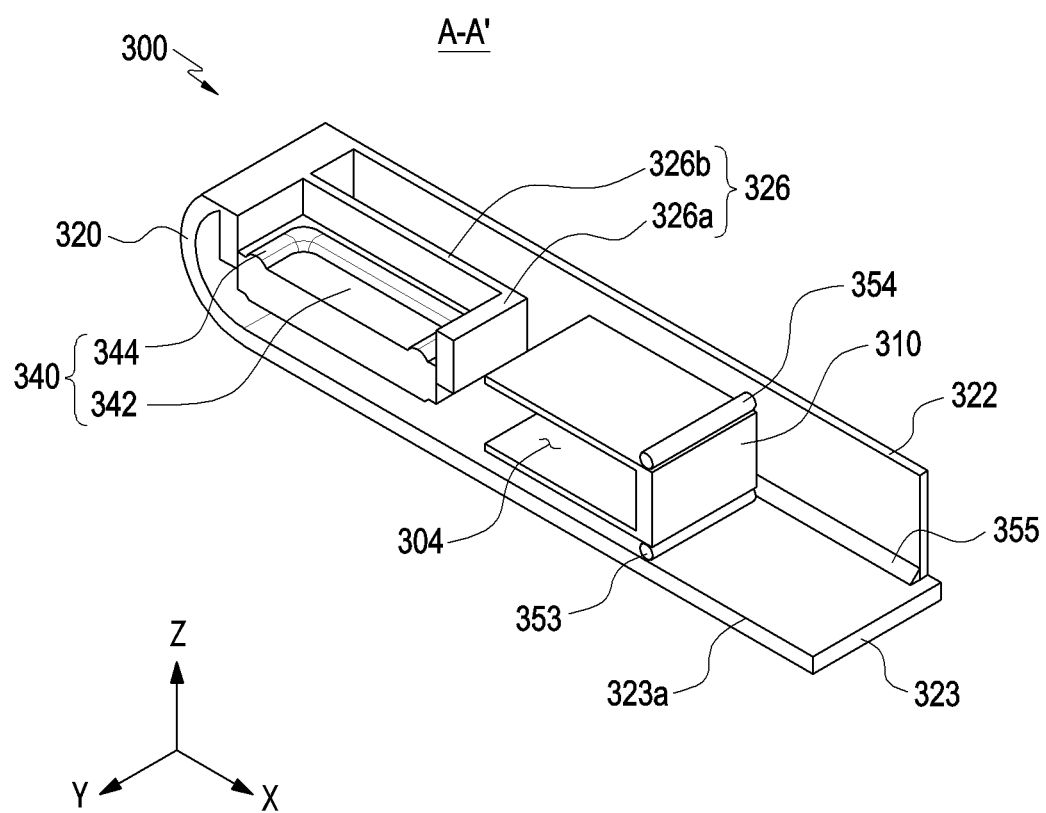
FIG. 7 is a cross-sectional view taken along line A-A' in FIG. 6.
Figure 8A:
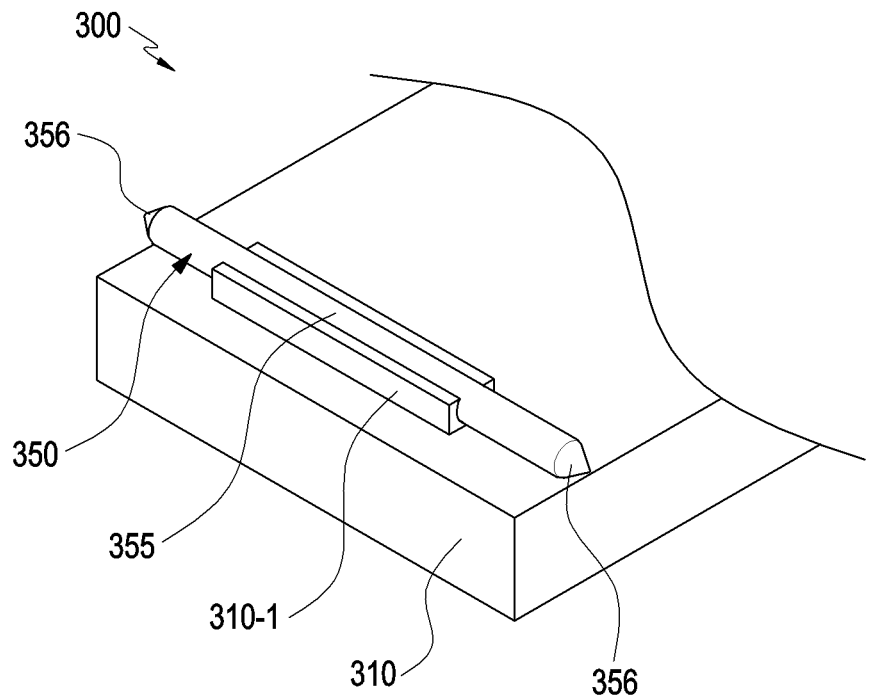
FIG. 8A is a perspective view of an example electronic device including a roller structure connected to a first housing according to certain embodiments of the disclosure.
Figure 8B:
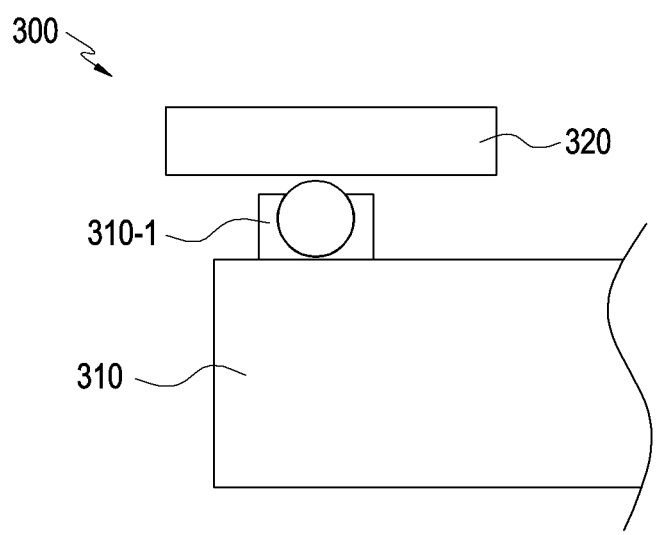
FIG. 8B is a perspective view of the electronic device including the roller structure according to certain embodiments of the disclosure.

FIG. 6 is an internal perspective view of an electronic device including a roller structure, according to certain embodiments of the disclosure. FIG. 7 is a cross-sectional view taken along line A-A' in FIG. 6. FIG. 8A is a perspective view of a roller structure connected to a first housing according to certain embodiments of the disclosure, and FIG. 8B is a schematic view of an electronic device including the roller structure according to certain embodiments of the disclosure.

Referring to FIGS. 6, 7, 8A, and 8B, the electronic device 300 may include a resonance space 304, a first housing 310, a second housing 320, and a speaker module 340. The configurations of the electronic device 300, the resonance space 304, the first housing 310, the second housing 320, and the speaker module 340 of FIGS. 6, 7, 8A, and 8B may be the same in whole or in part as those of the electronic device 200, the resonance space 206, the first housing 210, the second housing 220, and the speaker module 260 of FIGS. 5A and 5B.

According to certain embodiments, at least a portion of the first housing 310 may be located in the second housing 320. According to an embodiment, the first housing 310 may include structures facing the inside of the second housing 320. For example, the first housing 310 may include a $(1\text{-}1)^{th}$ side wall 311, a $(1\text{-}2)^{th}$ side wall 312 substantially parallel to the $(1\text{-}1)^{th}$ side wall 311 and facing the $(1\text{-}1)^{th}$ side wall 311, a $(1\text{-}1)^{th}$ plate 313 configured to support the $(1\text{-}1)^{th}$ side wall 311 and the $(1\text{-}2)^{th}$ side wall 312, and a $(1\text{-}2)^{th}$ plate 314 substantially parallel to the $(1\text{-}1)^{th}$ plate 313 and facing the $(1\text{-}1)^{th}$ plate 313. The $(1\text{-}1)^{th}$ side wall 311 may face at least a portion of the $(2\text{-}1)^{th}$ side wall 321, the $(1\text{-}2)^{th}$ side wall 312 may face at least a portion of the $(2\text{-}2)^{th}$ side wall 322, the $(1\text{-}1)^{th}$ plate 313 may face at least a portion of the $(2\text{-}1)^{th}$ plate 323, and the $(1\text{-}2)^{th}$ plate 314 may face at least a portion of the $(2\text{-}2)^{th}$ plate 324. According to an embodiment, the first housing 310 may be surrounded by a first inner surface 321*a* of the $(2\text{-}1)^{th}$ side wall 321, a second inner surface 321*b* of the $(2\text{-}2)^{th}$ second side wall 322, and a third inner surface 321*c* of the $(2\text{-}1)^{th}$ plate 323, and a fourth inner surface 321*d* of the $(2\text{-}2)^{th}$ second plate 324.

According to an embodiment, the $(1\text{-}1)^{th}$ side wall 311, the $(1\text{-}2)^{th}$ side wall 312, the $(1\text{-}1)^{th}$ plate 313, and/or the $(1\text{-}2)^{th}$ plate 314 may be connected to the first support member (e.g., the first support member 211 in FIG. 5B) of the first housing 310. According to an embodiment, the $(1\text{-}1)^{th}$ side wall 311, the $(1\text{-}2)^{th}$ side wall 312, the $(1\text{-}1)^{th}$ plate 313, and/or the $(1\text{-}2)^{th}$ plate 314 may be integrated with the first support member 211.

According to certain embodiments, the second housing 320 may be configured to accommodate the first housing 310. According to an embodiment, the second housing 320 may include a $(2\text{-}1)^{th}$ side wall 321, a $(2\text{-}2)^{th}$ side wall 322 facing the $(2\text{-}1)^{th}$ side wall 321, a $(2\text{-}1)^{th}$ plate 323 configured to support the $(2\text{-}1)^{th}$ side wall 321 and the $(2\text{-}2)^{th}$ side wall 322, and a $(2\text{-}2)^{th}$ plate 324 facing the $(2\text{-}1)^{th}$ plate 323. According to an embodiment, the $(2\text{-}1)^{th}$ side wall 321 may define at least a portion of the exterior of the electronic device 300. For example, the $(2\text{-}1)^{th}$ side wall 321 may be the third side member 221*c* and/or the second side member 221*b* of FIG. 3. According to an embodiment, the $(2\text{-}1)^{th}$ side wall 321 may include at least one speaker hole 327.

According to an embodiment, the $(2\text{-}1)^{th}$ side wall 321, the $(2\text{-}2)^{th}$ side wall 322, the $(2\text{-}1)^{th}$ plate 323, and/or the $(2\text{-}2)^{th}$ plate 324 may be configured to be connected to the second support member (e.g., the second support member 221 in FIG. 5B) of the second housing 320. According to an embodiment, the $(2\text{-}1)^{th}$ side wall 321, the $(2\text{-}2)^{th}$ side wall 322, the $(2\text{-}1)^{th}$ plate 323, and/or the $(2\text{-}2)^{th}$ plate 324 may be integrated with the second support member 221.

According to certain embodiments, the second housing 320 may include an inclined structure 325 to seal the space between the first housing 310 and the second housing 320 together with the roller structure 350. According to an embodiment, the inclined structure 325 may be oriented as to face the side walls 321 and 322 and the plates 323 and 324. For example, the inclined structure 325 may have a substantially triangular prism shape. According to an embodiment, the inclined structure 325 may include a first inclined structure 325-1 facing the $(2\text{-}1)^{th}$ side wall 321 and the $(2\text{-}1)^{th}$ plate 323, a second inclined structure 325-2 facing the $(2\text{-}2)^{th}$ side wall 322 and the $(2\text{-}1)^{th}$ plate 323, a third inclined structure (not illustrated) facing the $(2\text{-}1)^{th}$ side wall 321 and the $(2\text{-}2)^{th}$ plate 324, and a fourth inclined structure 325-4 facing the $(2\text{-}2)^{th}$ side wall 322 and the $(2\text{-}2)^{th}$ plate 324.

According to certain embodiments, the inclined structure 325 may face the roller structure 350. For example, the inclined structure 325 may include an inclined surface 325*a* to face the end region 356 of the roller structure 350. According to an embodiment, the inclined structure 325 may prevent or reduce leakage of air from the resonance space 304 to the outside of the electronic device 300 together with the roller structure 350. For example, the resonance space 304 may be surrounded by the first housing 310, the second housing 320, the roller structure 350, and the inclined structure 325.

According to certain embodiments, the second housing 320 may include a speaker accommodation structure 326 surrounding at least a portion of the speaker module 340. According to an embodiment, the speaker accommodation structure 326 may separate the speaker module 340 from the resonance space 304. For example, at least a portion of the resonance space 304 may be surrounded by the speaker accommodation structure 326. According to an embodiment, the speaker accommodation structure 326 may include a first speaker accommodation structure 326a disposed between the speaker module 340 and the first housing 310 and a second speaker accommodation structure 326b disposed between the speaker module 340 and the $(2-2)^{th}$ side wall 322.

According to certain embodiments, the speaker module 340 may include a speaker unit 342 and a speaker frame 344 configured to accommodate the speaker unit 342.

According to an embodiment, the speaker unit 342 may convert an electrical signal into sound. For example, the speaker unit 342 may include at least one of a coil (e.g., a voice coil) (not illustrated) configured to vibrate a diaphragm based on pulse width modulation (PWM), a diaphragm (not illustrated) configured to vibrate, a damping member (e.g., a spring (not illustrated)) made of a conductive material and configured to transmit a signal (e.g., electric power) transmitted from the outside of the speaker module 340 to the coil, a magnet (not illustrated), or a conductive plate (not illustrated) configured to concentrate a magnetic field generated by the magnet.

According to an embodiment, the speaker frame 344 may define at least a part of the outer surface of the speaker module 340. For example, the speaker frame 344 may be a component configured to accommodate the components of the speaker unit 342 (e.g., the coil, the diaphragm, and the damping member), and may include at least one of a protective cover (not illustrated), formed to protect the diaphragm, or a yoke formed to protect a component of the speaker unit 342 (e.g., the magnet). For example, the speaker frame 344 may mean a housing or a casing surrounding the speaker unit 342. According to an embodiment, at least a portion of the speaker frame 344 may be used as a resonator, which may resonate at least some of the sound generated by the speaker unit 342. For example, the speaker frame 344 may include an empty space (not illustrated), and the empty space (not illustrated) may be used in combination with the resonance space 304, as a place in which the vibration generated by the speaker module 340 is resonated.

According to certain embodiments, the electronic device 300 may include at least one roller structure 350 configured to seal the space between the first housing 310 and the second housing 320. For example, the roller structure 350 may be disposed between the first housing 310 and the second housing 320 and may guide the sliding movement of the first housing 310 relative to the second housing 320. According to an embodiment, the roller structure 350 may surround at least a portion of the space between the first housing 310 and the second housing.

According to certain embodiments, the roller structure 350 may be rotatably connected to the first housing 310 and/or the second housing 320. According to an embodiment (e.g., FIG. 8A or FIG. 8B), the at least one roller structure 350 is rotatably connected to the first housing 310 and is rotatable relative to the second housing 320. According to an embodiment (not illustrated), the at least one roller structure 350 is rotatably connected to the second housing 320 and is rotatable relative to the first housing 310. According to an embodiment (not illustrated), some of the plurality of roller structures 350 may be rotatably connected to the first housing 310 to rotate relative to the second housing 320, and the other ones of the plurality of roller structures 350 may be rotatably connected to the second housing 320 to rotate relative to the first housing 310.

According to certain embodiments, the roller structures 350 may include a plurality of roller structures 351, 352, 353, and 354, which are rotatably connected to the side walls 311 and 312 and/or the plates 313 and 314 of the first housing 310 and face the side walls 321 and 322 and/or the plate 323 and 324 of the second housing 320 in the state of being in contact therewith. For example, the roller structure 350 may include a first roller structure 351 rotatably connected to the $(1-1)^{th}$ side wall 311 and configured to rotate relative to the $(2-1)^{th}$ side wall 321, a second roller structure 352 rotatably connected to the $(1-2)^{th}$ side wall 312 and configured to rotate relative to the $(2-2)^{th}$ side wall 322, a third roller structure 353 rotatably connected to the $(1-1)^{th}$ plate 313 and configured to rotate relative to the $(2-1)^{th}$ plate 323, and a fourth roller structure 354 rotatably connected to the $(1-2)^{th}$ plate 314 and configured to rotate relative to the $(2-2)^{th}$ plate 324. According to another embodiment, the roller structure 350 may include a plurality of roller structures 351, 352, 353, and 354, which are rotatably connected to the side walls 321 and 322 and/or the plates 323 and 334 of the second housing 320 and face the side walls 311 and 312 and/or the plates 313 and 314 in the state of being in contact therewith. For example, the roller structure 350 may include a first roller structure 351 rotatably connected to the $(2-1)^{th}$ side wall 321 and configured to rotate relative to the $(1-1)^{th}$ side wall 311, a second roller structure 352 rotatably connected to the $(1-2)^{th}$ side wall 312 and configured to rotate relative to the $(2-2)^{th}$ side wall 322, a third roller structure 353 rotatably connected to the $(1-1)^{th}$ plate 313 and configured to rotate relative to the $(2-1)^{th}$ plate 323, and a fourth roller structure 354 rotatably connected to the $(1-2)^{th}$ plate 314 and configured to rotate relative to the $(2-2)^{th}$ plate 324.

According to certain embodiments, the roller structure 350 may be function as a structure that provides sealing for the space defined between the first housing 310 and the second housing 320. For example, the roller structure 350 may include a central region 355 facing the first housing 310 and/or the second housing 320 and at least one end region extending from the central region 355. According to an embodiment, the central region 355 may include a substantially cylindrical shape, and may rotate when in the state of contacting with the first housing 310 and/or the second housing 320. According to an embodiment, the end region 356 may have a substantially conical shape. The conical end region 356 of the roller structure 350 may rotate in the state of contacting with the conical end region 356 of another roller structure 350. For example, the end regions 356 of the first roller structure 351 and the third roller structure 353 have a conical shape, and the end region 356 of the first roller structure 351 and the end region 356 of the third roller structure 353 may rotate while sealing the space between the first housing 310 and the second housing 320 while in the state of contacting with each other. According to an embodiment, the central region 355 of the roller structure 350 may be rotatably mounted in the roller structure accommodation unit 310-1 disposed on the first housing 310. The roller structure accommodation unit 310-1 may face the second housing 320.

Figure 9:
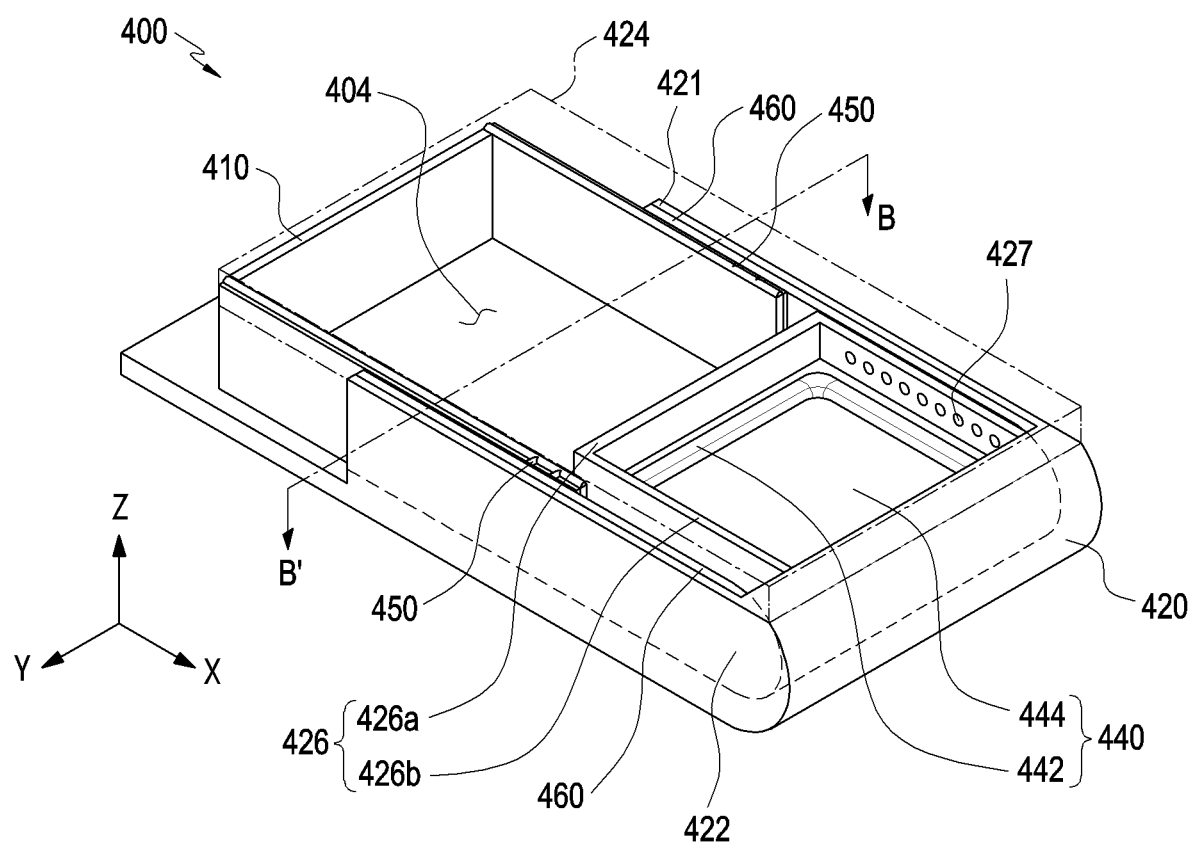
FIG. 9 is an internal perspective view of an example electronic device including a protruding structure, according to certain embodiments of the disclosure.
Figure 10:
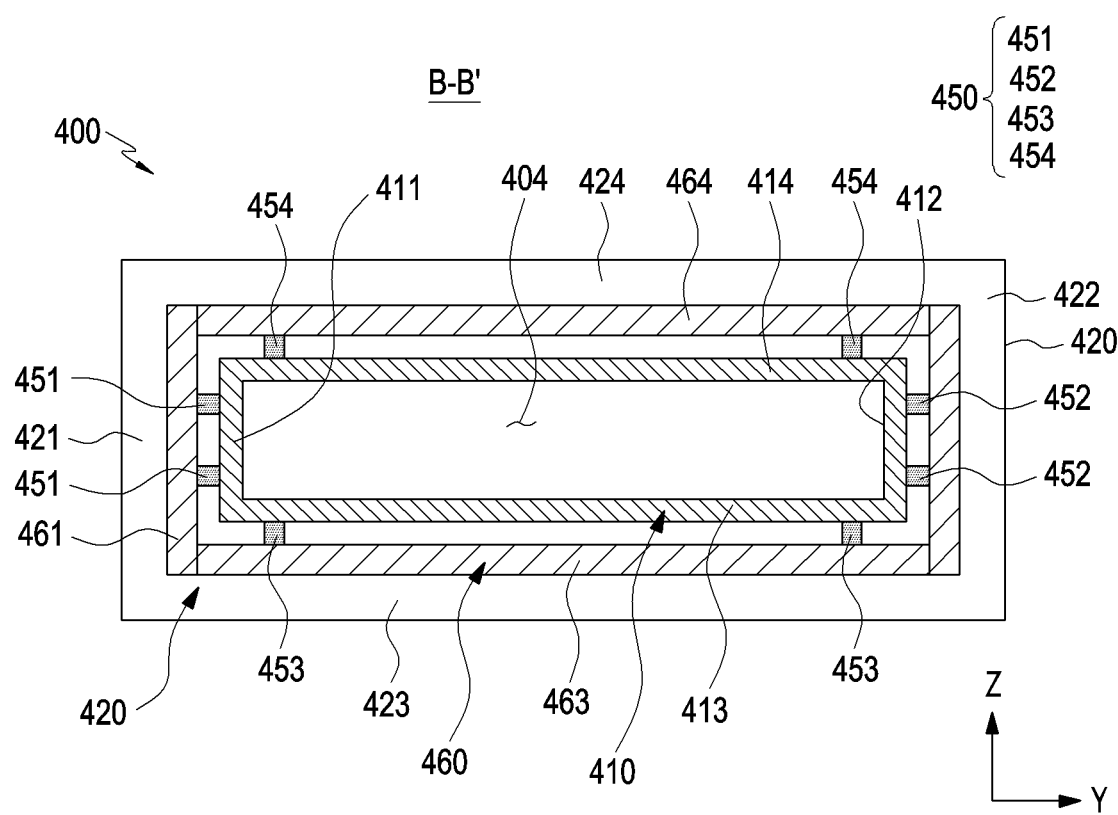
FIG. 10 is a cross-sectional view taken along line A-A' in FIG. 9.

FIG. 9 is an internal perspective view of an electronic device including a protruding structure, according to certain embodiments of the disclosure. FIG. 10 is a cross-sectional view taken along line A-A' in FIG. 9.

Referring to FIGS. 9 and 10, an electronic device 400 may include a resonance space 404, a first housing 410, a second housing 420, and a speaker module 440. The configurations of the electronic device 400, the resonance space 404, the first housing 410, the second housing 420, the speaker accommodation structure 426, and the speaker module 440 of FIGS. 9 and 10 may be the same in whole or in part as those of the electronic device 300, the resonance space 304, the first housing 310, the second housing 320, the speaker accommodation structure 326, and the speaker module 340 of FIGS. 6, 7, 8A and/or 8B.

According to certain embodiments, the electronic device 400 may include at least one protruding structure 450 configured to seal the space between the first housing 410 and the second housing 420. The protruding structure 450 may be disposed between the first housing 410 and the second housing 420 to prevent or reduce the leakage of air from the resonance space 404. According to an embodiment, the protruding structure 450 may surround at least a portion of the space between the first housing 410 and the second housing 420. For example, the protruding structure 450 may have a closed loop shape.

According to certain embodiments, the protruding structures 450 may include a plurality of protruding structures 451, 452, 453, and 454.

According to an embodiment (e.g., FIG. 10), the protruding structure 450 may be disposed on the first housing 410 or may be provided in the first housing 410. The protruding structures 450 may be located on the inner surface of the first housing 410 facing the inside of the electronic device 400. For example, the protruding structures 450 may extend from the side walls 411 and 412 and/or the plates 413 and 414 of the first housing 410. For example, the protruding structures 450 may include a first protruding structure 451 extending from the $(1-1)^{th}$ side wall 411 of the first housing 410, a second protruding structure 452 extending from the $(1-2)^{th}$ side wall 412, a third protruding structure 453 extending from the $(1-1)^{th}$ plate 413, and a fourth protruding structure 454 extending from the $(1-2)^{th}$ plate 414. Here, the protruding structures 450 extending from the side walls 411 and 412 and/or the plates 413 and 414 may include the protruding structures 450 disposed on the side walls 411 and 412 and/or the plates 413 and 414 or protruding structures 450 provided on the side walls 411 and 412 and/or the plates 413 and 414. For example, the protruding structures 450 may be integrated with the first housing 410. As another example, the protruding structures 450 may be implemented as separate components surrounding at least a portion of the first housing 410.

According to an embodiment (e.g., not illustrated), the protruding structures 450 may be disposed on the second housing 420 or may be provided in the second housing 420. For example, the protruding structures 450 may extend from the side walls 421 and 422 and/or the plates 423 and 424 of the first housing 420. For example, the protruding structures 450 may include a first protruding structure (not illustrated) extending from the $(2-1)^{th}$ side wall 421 of the second housing 420, a second protruding structure (not illustrated) extending from the $(2-2)^{th}$ side wall 422, a third protruding structure (not illustrated) extending from the $(2-1)^{th}$ plate 423, and a fourth protruding structure (not illustrated) extending from the $(2-2)^{th}$ plate 424. Here, the protruding structures 450 extending from the side walls 421 and 422 and/or the plates 423 and 424 may include the protruding structures 450 disposed on the side walls 421 and 422 and/or the plates 423 and 424 or protruding structures 450 provided on the side walls 421 and 422 and/or the plates 423 and 424. For example, the protruding structures 450 may be integrated with the second housing 420. As another example, the protruding structures 450 may be separate components surrounding at least a portion of the second housing 420.

According to certain embodiments, the electronic device 400 may include a guide member 460, at least a portion of which is disposed between the first housing 410 and the second housing 420. According to an embodiment, the guide member 460 may be slidable relative to the protruding structures 450. For example, when the protruding structures 450 are connected to the first housing 410, the guide member 460 may be connected to the second housing 420, and when the protruding structures 450 are connected to the second housing 420, the guide member 460 may be connected to the first housing 410. According to an embodiment, the guide member 460 may have a closed loop shape.

According to certain embodiments, the protruding structures 450 may slide while in the state contact with the guide member 460. According to an embodiment, the protruding structures 450 may be oriented to face the guide member 460. The guide member 460 may be formed of a material that reduces frictional force generated during sliding motion of the protruding structures 450. For example, the guide member 460 may be manufactured using a material (e.g., high-density polyethylene (HDPE)) having a friction coefficient lower than that of the second support member (e.g., the second support member 221 of FIG. 5B) of the second housing 320.

According to certain embodiments (e.g., FIG. 9), the guide member 460 may be disposed on the second housing 420. According to an embodiment, the guide member 460 may be disposed on the side walls 421 and 422 of the second housing 420 and/or the plates 423 and 424. For example, the guide member 460 may include a first guide member 461 disposed on the $(2-1)^{th}$ side wall 421 of the second housing 420, a second guide member 461 disposed on the $(2-2)^{th}$ side wall 422, a third guide member 463 disposed on the $(2-1)^{th}$ plate 423, and a fourth guide member 464 disposed on the $(2-2)^{th}$ second plate 424. According to an embodiment, the first guide member 461, the second guide member 462, the third guide member 463, and/or the fourth guide member 464 may be integrated with each other.

According to certain embodiments (not illustrated), the guide member 460 may be disposed on the first housing 410. According to an embodiment, the guide member 460 may be disposed on the side walls 411 and 412 of the first housing 420 and/or the plates 413 and 414. For example, the guide member 460 may include a first guide member 461 (not illustrated) disposed on the $(1-1)^{th}$ side wall 411 of the second housing 410, a second guide member (not illustrated) disposed on the $(1-2)^{th}$ side wall 412, a third guide member (not illustrated) disposed on the $(1-1)^{th}$ plate 413, and a fourth guide member (not illustrated) disposed on the $(2-2)^{th}$ plate 424.

According to certain embodiments, the resonance space 404 may be surrounded by the first housing 410, the second housing 420, the protruding structure 450, and the guide member 460. The size of the resonance space 404 may be changed based on the sliding movement of the first housing 410.

Figure 11A:
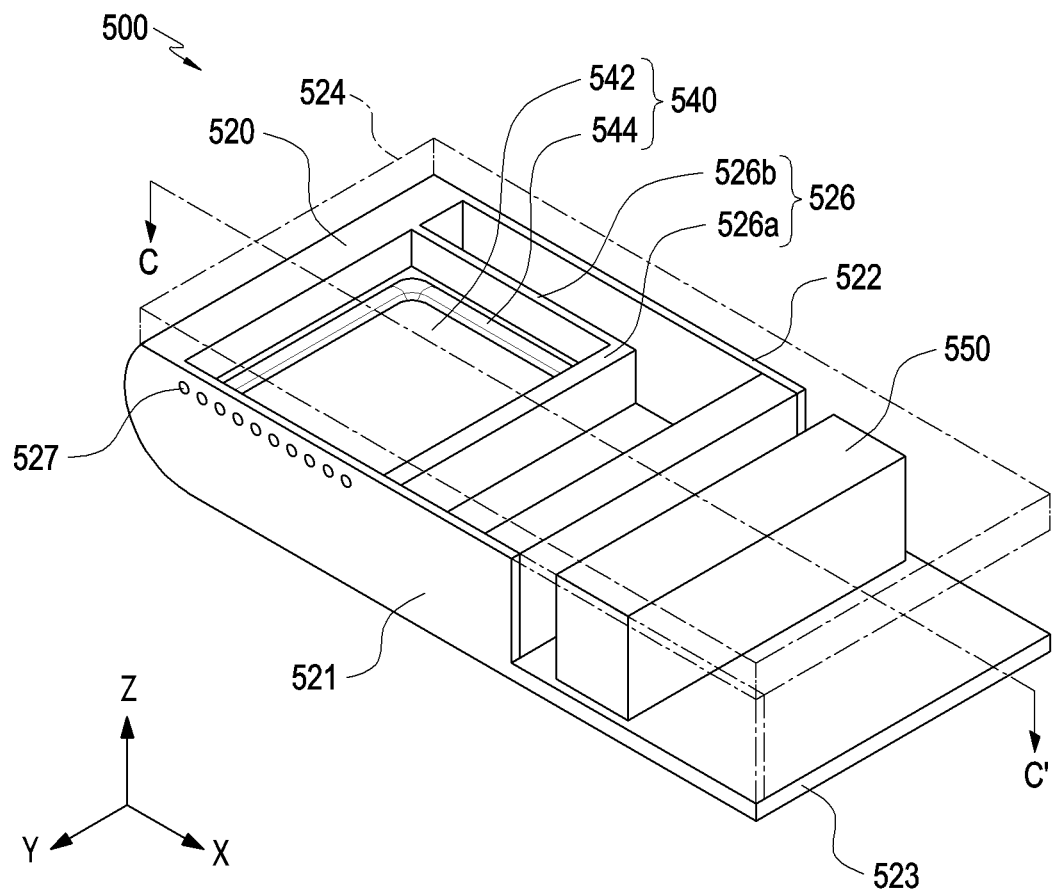
FIG. 11A is an internal perspective view of an example electronic device including a foldable sealing structure according to certain embodiments of the disclosure in the closed state.
Figure 11B:
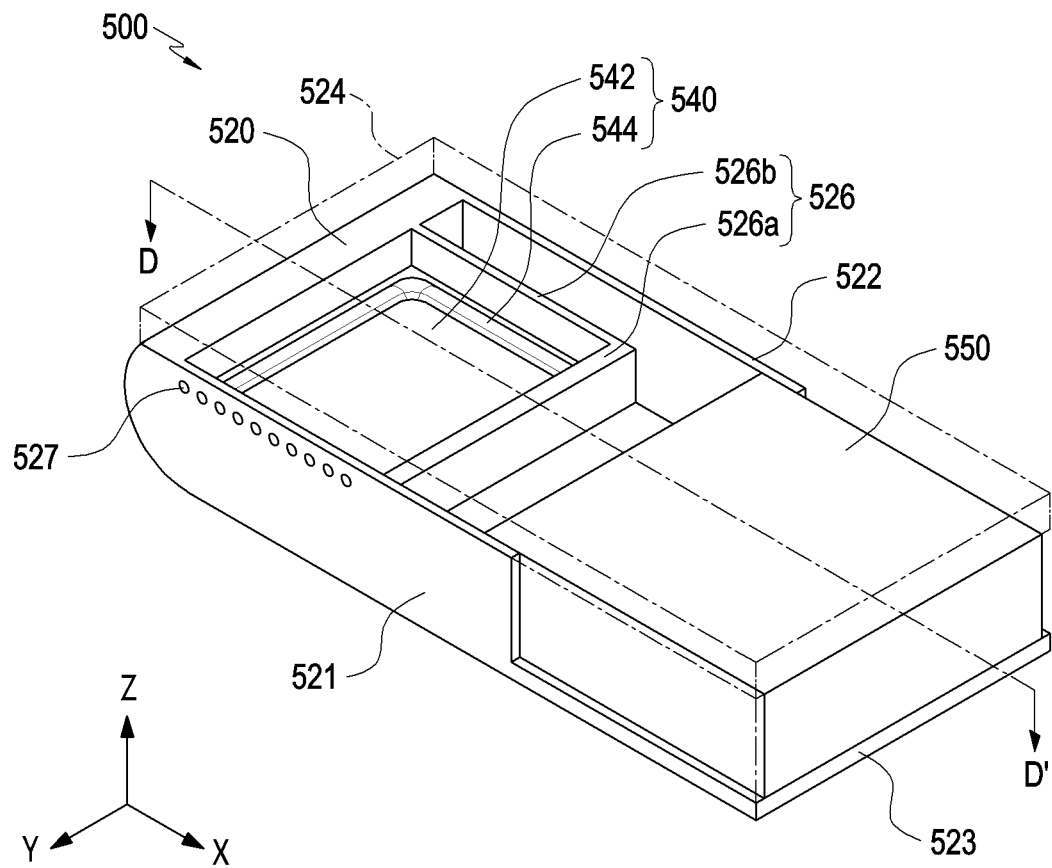
FIG. 11B is an internal perspective view of the electronic device including the foldable sealing structure according to certain embodiments of the disclosure in the open state.
Figure 12A:
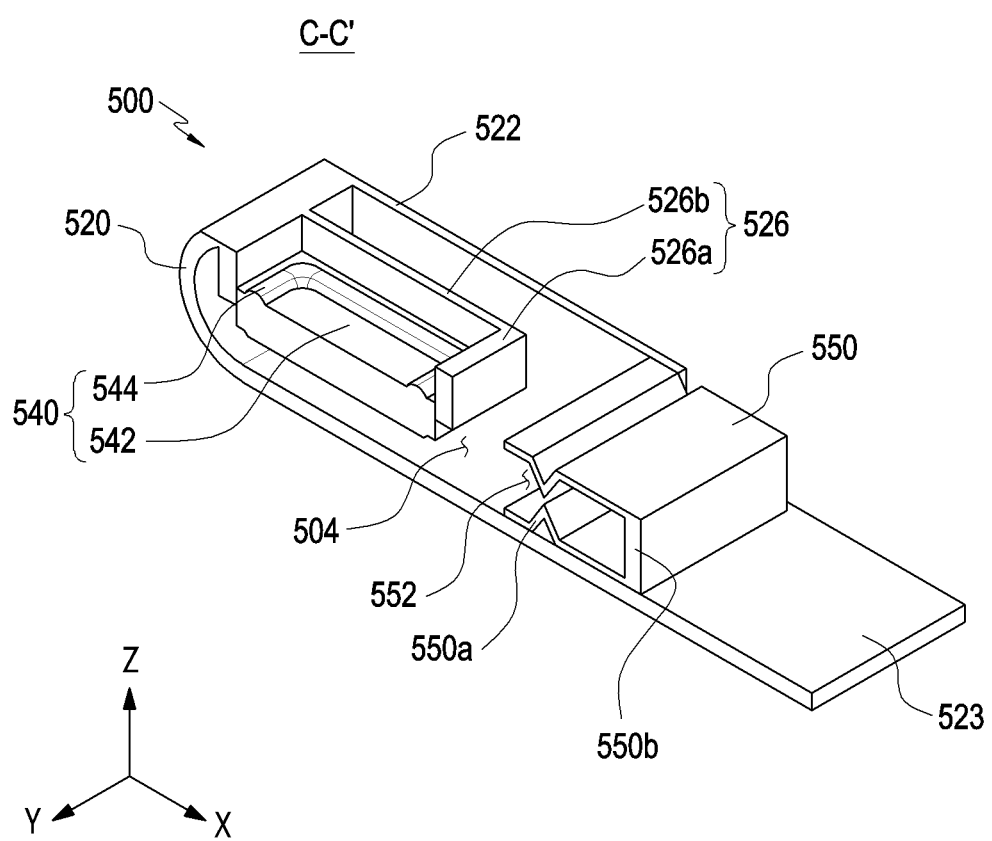
FIG. 12A is a cross-sectional view taken along line C-C' in FIG. 11A.
Figure 12B:
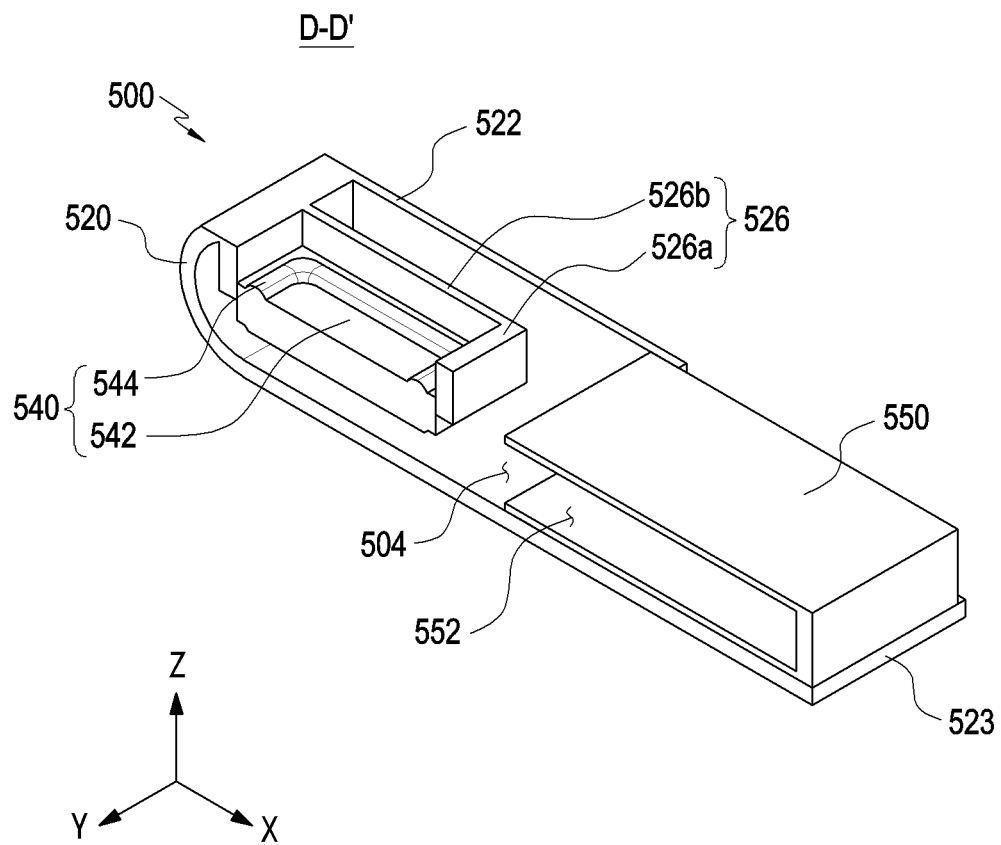
FIG. 12B is a cross-sectional view taken along the line D-D' in FIG. 11B.

FIG. 11A is an internal perspective view of an electronic device including a sealing member according to certain embodiments of the disclosure in the closed state, and FIG. 11B is an internal perspective view of the electronic device including the sealing member according to certain embodiments of the disclosure in the open state. FIG. 12A is a cross-sectional view taken along line C-C' in FIG. 11A, and FIG. 12B is a cross-sectional view taken along the line D-D' in FIG. 11B.

Referring to FIGS. 11A, 11B, 12A, and 12B, an electronic device 500 may include a resonance space 504, a second housing 520, and a speaker module 540. The configurations of the electronic device 500, the resonance space 504, the second housing 520, the speaker accommodation structure 526, and the speaker module 540 of FIGS. 11A, 11B, 12A, and 12B may be the same in whole or in part as those of the electronic device 300, the resonance space 304, the first housing 310, the second housing 320, the speaker accommodation structure 326, and the speaker module 340 of FIGS. 6, 7, 8A and/or 8B.

According to certain embodiments, the electronic device 500 may include a sealing member 550 sealing the space defined between the first housing (e.g., the first housing 210 in FIG. 5B) and the second housing 520. The sealing structure 550 may be disposed between the first housing 210 and the second housing 520 to prevent or reduce the leakage of air from the resonance space 504. According to an embodiment, the sealing member 550 may be operatively connected to the second housing 520 and the first housing 210. For example, a first sealing member region 550a of the sealing member 550 in which the recess 552 is provided may be connected to the second housing 520, and a second sealing member region 550b located opposite to the first sealing member region 550a may be connected to the first housing 510. According to an embodiment, the sealing member 550 may include a foldable structure. For example, the sealing member 550 may include a corrugated extension structure, and may be unfolded or folded according to the sliding movement of the first housing 210. According to an embodiment, the sealing member 550 may be formed of a flexible material.

According to certain embodiments, the sealing member 550 may prevent or reduce the leakage of air from the resonance space 504. For example, the sealing member 550 may face a $(2-1)^{th}$ side wall 521, a $(2-2)^{th}$ side wall 522, a $(2-1)^{th}$ plate 523, and a $(2-2)^{th}$ plate 524 of the second housing 520. The sealing member 550 may be folded or unfolded in the state of being in contact with side walls 521 and 522 of the second housing 520 and/or the plates 523 and 524 so that air leakage from the space between the second housing 520 and the sealing member 550 can be prevented or reduced.

According to certain embodiments, the sealing member 550 may include a recess 552 facing the speaker module 540. The volume of the recess 552 may be changed based on the sliding movement of the first housing (e.g., the first housing 201 of FIG. 2). For example, the volume of the recess 552 in the state in which the electronic device 500 is closed (e.g., FIG. 12A) may be smaller than that of the recess 552 in the state in which the electronic device 500 is opened (e.g., FIG. 12B). According to an embodiment, the recess 552 may provide a space in which the sound generated by the speaker module 540 is resonated together with the resonance space 504. According to an embodiment, the resonance space 504 may include a configuration including the recess 552. For example, the size of the resonance space 504 may be changed based on the sliding movement of the first housing 201.

Figure 13:
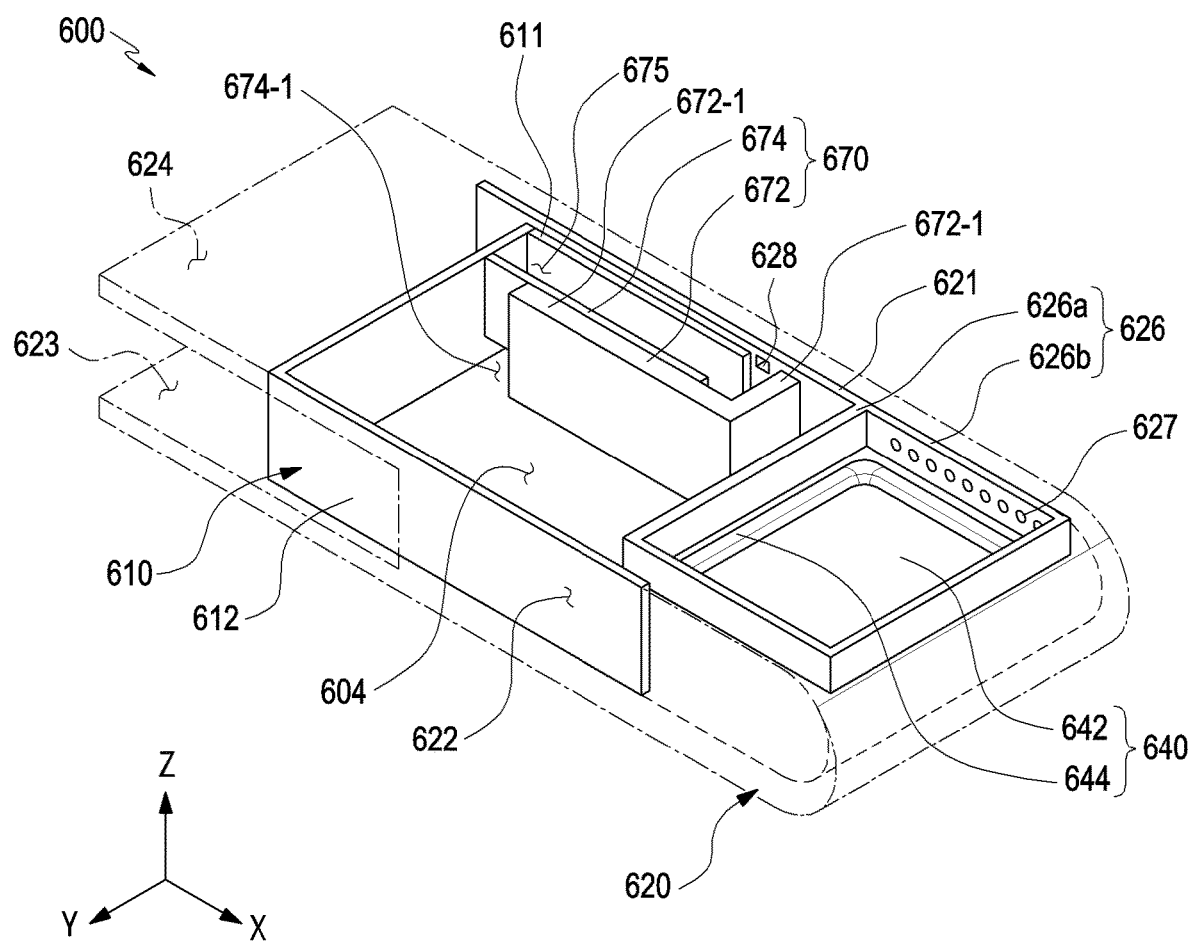
FIG. 13 is an internal perspective view of an example electronic device including a reflex port according to certain embodiments of the disclosure in the closed state.
Figure 14:
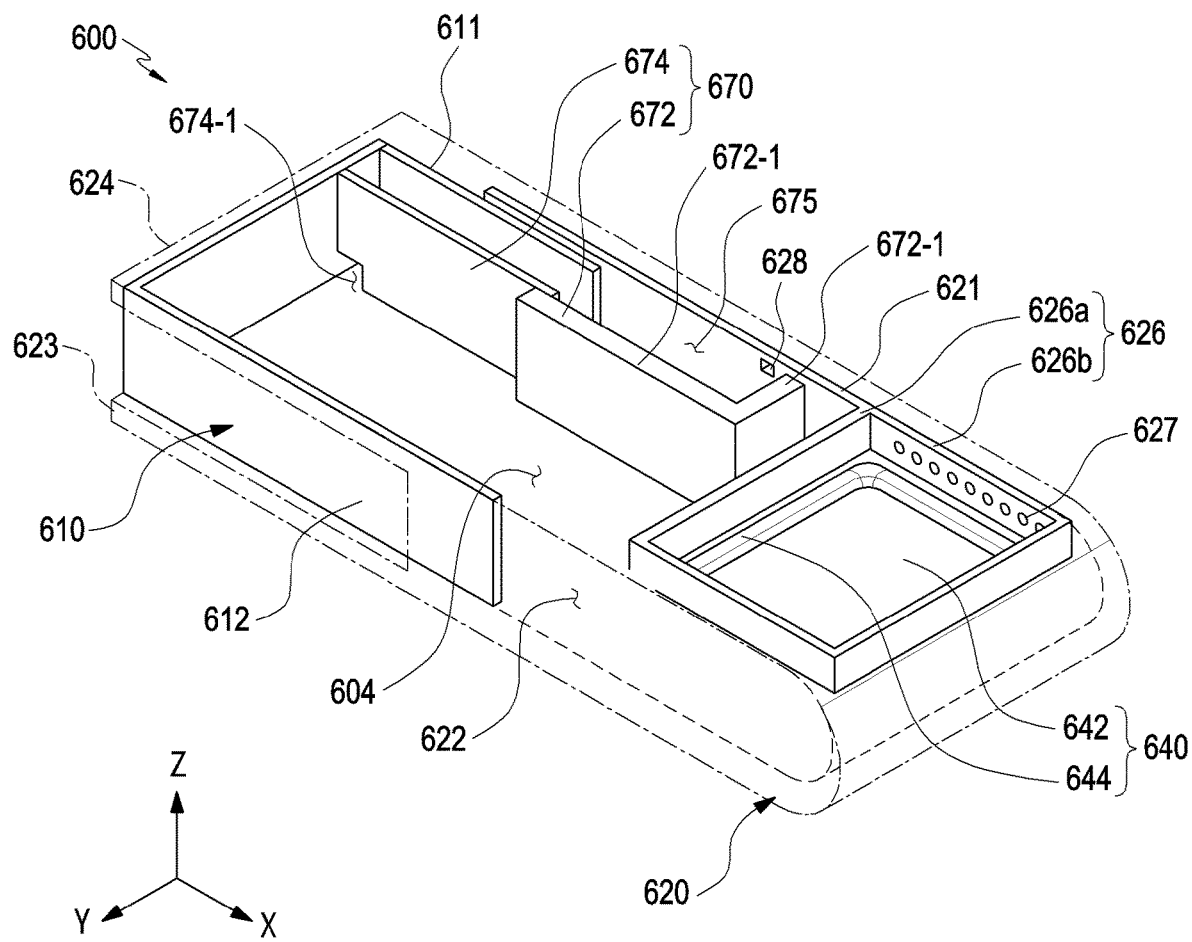
FIG. 14 is an internal perspective view of an example electronic device including a reflex port according to certain embodiments of the disclosure in the open state.

FIG. 13 is an internal perspective view of an electronic device including a reflex port according to certain embodiments of the disclosure in the closed state. FIG. 14 is an internal perspective view of an electronic device including a reflex port according to certain embodiments of the disclosure in the open state.

Referring to FIGS. 13 and 14, an electronic device 600 may include a resonance space 604, a first housing 610, a second housing 620, and a speaker module 640. The configurations of the electronic device 600, the resonance space 604, the first housing 610, the second housing 620, and the speaker module 640 of FIGS. 13 and 14 may be the same in whole or in part as those of the electronic device 400, the resonance space 404, the first housing 410, the second housing 420, and the speaker module 440 of FIGS. 9 and 10. According to an embodiment, the electronic device 600 may include a protruding structure (e.g., the protruding structure 450 in FIG. 9) to seal the space between the first housing 610 and the second housing 620 and a guide member (e.g., the guide member 460 in FIG. 9).

According to certain embodiments, the electronic device 600 may include a reflex port 670 configured to improve the sound of a low-frequency band generated by the speaker module 640. According to an embodiment, the reflex port 670 may provide a sound path between an external environment of the electronic device 600 and the speaker unit 642, and may amplify the sound of the low-frequency band generated by the speaker unit 642. For example, the sound of a low-frequency band reflected from the interior of the electronic device 600 may be transmitted to the exterior of the electronic device 600 through the reflex port 670. According to an embodiment, the reflex port 670 may transmit vibration generated by the speaker unit 642 to the through hole 628 oriented towards the exterior of the electronic device 600. For example, the reflex port 670 may have a duct structure. According to an embodiment, the vibration generated in the speaker unit 642 of the speaker module 640 may be transmitted to the exterior of the electronic device 600 through the resonance space 604, the reflex port 670, and the through hole 628.

According to certain embodiments, the length of the reflex port 670 may be changed based on the sliding movement of the first housing 610. For example, the length of the reflex port 670 in the state in which the electronic device 600 is closed (e.g., FIG. 13) may be smaller than the length of the reflex port 670 in the state in which the electronic device 600 is opened (e.g., FIG. 14). According to an embodiment, the volume of the sound generated by the speaker module 640 may be increased in proportion to the volume and/or length of the reflex port 670. For example, when the length of the reflex port 670 is increased, the magnitude of a frequency at which a base peak is generated may be decreased. The base peak may mean a frequency at which the maximum amplitude of the sound generated by the speaker module 640 occurs.

According to certain embodiments, the reflex port 670 may include a first port structure 672 connected to the second housing 620, and a second port structure 674 connected to the first housing 610. According to an embodiment, at least a portion of the first port structure 672 may be oriented as to face a side wall (e.g., the $(2-1)^{th}$ side wall 621) of the second housing 620. For example, the first port structure 672 may include a $(1-1)^{th}$ port structure 672 extending from the (2-1)$^{th}$ side wall 621 and a (1-2)$^{th}$ port structure 674 extending from the (1-1)$^{th}$ port structure 672 and facing the through hole 628. According to an embodiment, at least a portion of the second port structure 674 may face a side wall (e.g., the (1-1)$^{th}$ side wall 611) of the first housing 610. For example, the second port structure 674 may include a side wall disposed substantially parallel to the (1-1)$^{th}$ side wall 611. According to an embodiment, the second port structure 674 may face the first port structure 672 and may slide in the width-wise direction of the electronic device 600 (e.g., the X-axis direction). For example, the second port structure 674 may be disposed between the (1-1)$^{th}$ port structure 672-1 of the first port structure 672 and the (1-1)$^{th}$ side wall 611.

According to certain embodiments, the electronic device 600 may include a sealing structure (e.g., the roller structure 350 in FIG. 6, the protruding structure 450 and the guide member 460 in FIG. 9, and/or the sealing structure 550 in FIG. 11A) for reducing the leakage of air through the space between the first port structure 672 and the second port structure 674.

According to certain embodiments, the reflex port 670 may include reflex space 675 connected to the resonance space 604. The reflex space 675 may be surrounded by the first housing 610 (e.g., a (1-1)$^{th}$ side wall 611), the second housing 620 (e.g., the (2-1)$^{th}$ side wall 621, and the (2-1)$^{th}$ plate 623, and the (2-4)$^{th}$ plate 624), the first port structure 672, and the second port structure 674. According to an embodiment, the reflex space 675 may be connected to the resonance space 604. For example, the second port structure 674 may include at least one recess 674-1 facing the resonance space 604 and having an opening or groove shape. Air located in the resonance space 604 may be transmitted to the reflex space 675 and/or the outside of the electronic device 600 through the recess 674-1. According to an embodiment, the reflex space 675 may be interpreted as a space separate from the resonance space 604. According to an embodiment, the reflex space 675 may be interpreted as a portion of the resonance space 604.

Figure 15A:
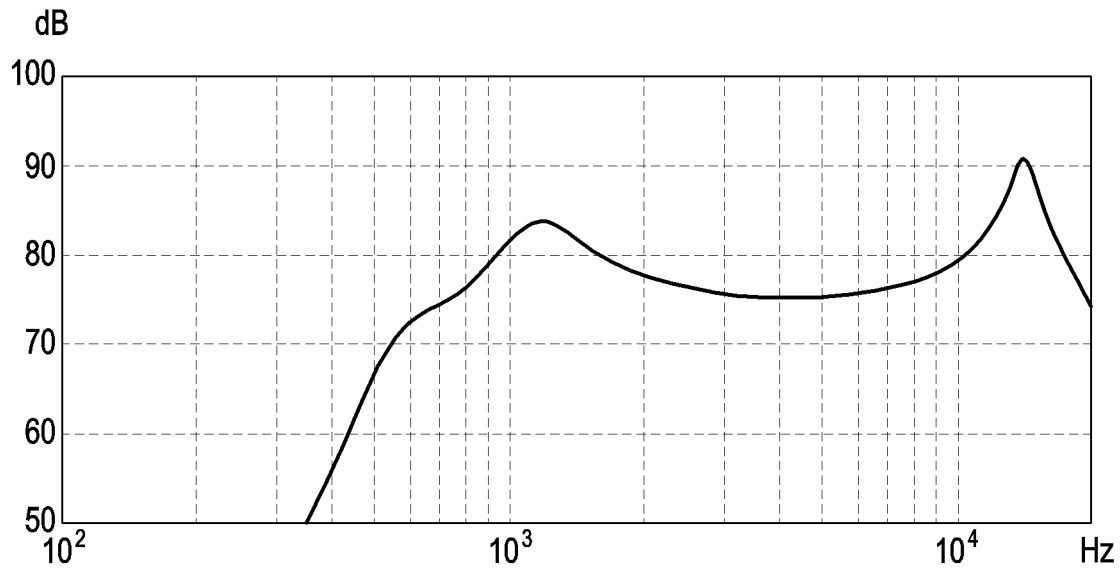
FIG. 15A is a view for describing a frequency response characteristic of an example speaker module according to certain embodiments of the disclosure in the closed state.
Figure 15B:
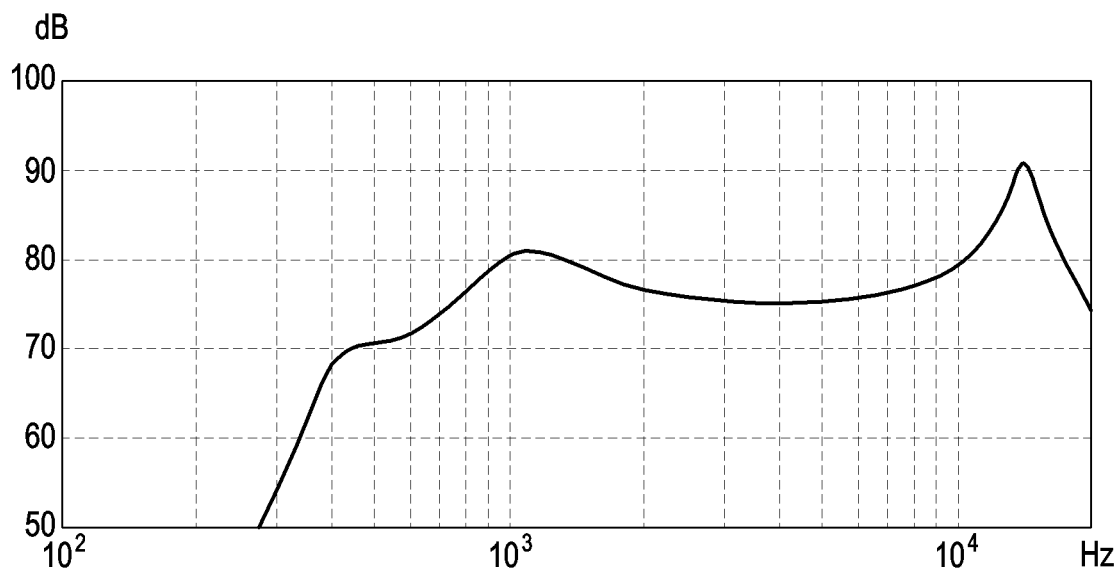
FIG. 15B is a view for describing a frequency response characteristic of the example speaker module according to certain embodiments of the disclosure in the open state.

FIG. 15A is a view for describing a frequency response characteristic of a speaker module according to certain embodiments of the disclosure in the closed state, and FIG. 15B is a view for describing a frequency response characteristic of the speaker module according to certain embodiments of the disclosure in the open state.

Referring to 15A and 15B, the volume of the sound generated by the speaker module (e.g., the speaker module 640 in FIG. 13) of the electronic device (e.g., the electronic device 600 of FIG. 13), according to the frequency, may be changed based on the size and/or the structure of the resonance space of the electronic device 600. For example, the sound generated by the speaker module 640 may be changed based on the volume of the resonance space (e.g., the resonance space 604 in FIG. 13) and/or the length of a reflex port (e.g., the reflex port 670 in FIG. 13). According to certain embodiments, the reflex port 670 may mean a bass reflex.

According to certain embodiments, the performance of the speaker module 640 in a low-frequency band may be improved in the state in which the electronic device 600 is opened. For example, the output of the low-frequency band of the speaker module 640 disposed in the electronic device 600 in the open state (e.g., FIG. 15B) may be greater than the output of the low-frequency band of the speaker module 640 disposed inside the electronic device 600 in the closed state (e.g., FIG. 15A). For example, the volume of the resonance space 604 and the length of the reflex port 670 in the state in which the electronic device 600 is opened may be greater or longer than the volume of the resonance space 604 and the length of the reflex port 670 in the state in which the electronic device 600 is closed. According to an embodiment, in the state in which the electronic device 600 is closed (e.g., FIG. 15A), the speaker module 640 may provide a substantially flat output from a frequency band of about 860 Hz, and in the state in which the electronic device 600 is opened (e.g., FIG. 15B), the speaker module 640 may provide a substantially flat output from a frequency band of about 720 Hz.

According to certain embodiments, the electronic device 200 may determine the volume of the resonance space 604 and/or the length of the reflex port 670. According to an embodiment, the processor (e.g., the processor 120 of FIG. 1) of the electronic device 200 may determine the state of the electronic device 200 or the degree to which the electronic device 200 is opened and may determine the volume of the resonance space 604 and/or the length of the reflex port 670 based on the degree to which the electronic device 200 is opened. For example, the processor 120 may determine whether the electronic device 200 is in the closed state (e.g., FIG. 2), the open state (e.g., FIG. 3), or an intermediate state (e.g., between the closed state and the open state) and may determine the volume of the resonance space 604 and/or the length of the reflex port 670 based on the determined state of the electronic device 200 or the degree to which the electronic device 200 is opened. For example, the electronic device 600 may include a first magnetic body (not illustrated) disposed within the first housing (e.g., the first housing 201 in FIG. 2) and a second magnetic body (not illustrated) disposed in the second housing (e.g., the second housing 202 in FIG. 2), and by using the magnitude of the magnetic field based on the separation distance between the first magnetic body and the second magnetic body, the electronic device 600 may determine the degree to which the electronic device 600 is opened, the volume of the resonance space 604, and/or the length of the reflex port 670. As another example, the electronic device 600 may include contact pins (e.g., pogo pins) (not illustrated) configured to change an electrical connection path based on the sliding movement of the first housing (e.g., the first housing 201 in FIG. 2), and based on the resistance value of the changed electrical connection path, the electronic device 600 may determine the degree to which the electronic device 600 is opened, the volume of the resonance space 604, and/or the length of the reflex port 670.

According to certain embodiments, the electronic device 600 may optimize a speaker module (e.g., the speaker module 260 in FIG. 4). For example, the processor 120 may optimize the speaker module 260 based on the determined size of the resonance space 604, the determined length of the reflex port 670, the determined degree to which the electronic device 600 is opened, and/or the determined state of the electronic device 600. For example, the processor 120 may adjust the sound generated by the speaker unit (e.g., the speaker unit 342 in FIG. 6) based on the determined size of the resonance space 604, the determined length of the reflex port 670, the determined degree to which the electronic device 600 is opened, and/or the determined state of the electronic device 600.

According to certain embodiments of the disclosure, an electronic device (e.g., the electronic device 200 in FIG. 3) may include the housings (e.g., the housings 201 and 202 in FIG. 3) including a first housing (e.g., the first housing 201 in FIG. 3) and a second housing (e.g., the second housing 202 in FIG. 3) configured to accommodate at least a portion of the first housing and to guide sliding movement of the first housing, a display (e.g., the display 203 in FIG. 3) including a first display region (e.g., the first display region A1 in FIG. 3) disposed on the first housing and a second display region (e.g., the second display region A2 in FIG. 3) extending from the first display region, a speaker module (e.g., the speaker module 260 in FIG. 4) including a speaker unit (e.g., the speaker unit 342 in FIG. 6) and a speaker frame (e.g., the speaker frame 344 in FIG. 6) configured to accommodate the speaker unit disposed in the second housing, and at least one roller structure (e.g., the roller structure 350 in FIG. 6) to seal a space between the first housing and the second housing and to guide the sliding movement of the first housing relative to the second housing.

According to certain embodiments, the electronic device may further include a resonance space (e.g., the resonance space 304 in FIG. 7) at least a portion of which is surrounded by the first housing and the second housing, such that the resonance space is configured to change in size based on the sliding movement of the first housing.

According to certain embodiments, the at least one roller structure may be connected to the first housing and configured to rotate relative to the second housing.

According to certain embodiments, the second housing may include a $(2-1)^{th}$ side wall (e.g., the $(2-1)^{th}$ side wall 321 in FIG. 6), a $(2-2)^{th}$ side wall (e.g., the $(2-2)^{th}$ side wall 322 in FIG. 6) facing the $(2-1)^{th}$ side wall, a $(2-1)^{th}$ plate (e.g., the $(2-1)^{th}$ plate 323 in FIG. 6) configured to support the $(2-1)^{th}$ side wall and the $(2-2)^{th}$ side wall, and a $(2-2)^{th}$ plate (e.g., the $(2-2)^{th}$ plate 324 in FIG. 6) facing the $(2-1)^{th}$ plate, and the at least one roller structure may include a first roller structure (e.g., the first roller structure 351 in FIG. 6) configured to rotate relative to the $(2-1)^{th}$ side wall, a second roller structure (e.g., the second roller structure 352 in FIG. 6) configured to rotate relative to the $(2-2)^{th}$ side wall, a third roller structure (e.g., the third roller structure 353 in FIG. 6) configured to rotate relative to the $(2-1)^{th}$ plate, and a fourth roller structure (e.g., the fourth roller structure 354 in FIG. 6) configured to rotate relative to the $(2-2)^{th}$ plate.

According to certain embodiments, the second housing (e.g., the second housing 202 in FIG. 3) may include at least two roller structures among the first roller structure (e.g., the first roller structure 351 in FIG. 6), the second roller structure (e.g., the second roller structure 352 in FIG. 6), the third roller structure (e.g., the third roller structure 353 in FIG. 6), and/or the fourth roller structure (e.g., the fourth roller structure 354 in FIG. 6). For example, when at least one surface of the first housing (e.g., the first housing 201 in FIG. 3) may include a material (e.g., high-density polyethylene (HDPE)) having a low coefficient of friction, at least one roller structure may be omitted.

According to certain embodiments, the at least one roller structure may be connected to the second housing and configured to rotate relative to the first housing.

According to certain embodiments, the second housing may include a $(2-1)^{th}$ side wall (e.g., the $(2-1)^{th}$ side wall 321 in FIG. 6), a $(2-2)^{th}$ side wall (e.g., the $(2-2)^{th}$ side wall 322 in FIG. 6) facing the $(2-1)^{th}$ side wall, a $(2-1)^{th}$ plate (e.g., the $(2-1)^{th}$ plate 323 in FIG. 6) configured to support the $(2-1)^{th}$ side wall and the $(2-2)^{th}$ side wall, and a $(2-2)^{th}$ plate (e.g., the $(2-2)^{th}$ plate 324 in FIG. 6) facing the $(2-1)^{th}$ plate, and the at least one roller structure may include a first roller structure (e.g., the first roller structure 351 in FIG. 6) connected to the $(2-1)^{th}$ side wall, a second roller structure (e.g., the second roller structure 352 in FIG. 6) connected to the $(2-2)^{th}$ side wall, a third roller structure (e.g., the third roller structure 353 in FIG. 6) connected to the $(2-1)^{th}$ plate, and a fourth roller structure (e.g., the fourth roller structure 354 in FIG. 6) connected to the $(2-2)^{th}$ plate.

According to certain embodiments, the at least one roller structure may include a substantially cylindrical central region (e.g., the central region 355 in FIG. 8A) connected to the first housing, and a substantially conical end region (e.g., the end region 356 in FIG. 8A) extending from the central region.

According to certain embodiments, the second housing may include at least one inclined structure (e.g., the inclined structure 325 in FIG. 6) to seal a space between the first housing and the second housing together with the at least one roller structure, such that the inclined structure (e.g., the inclined structure 325 in FIG. 6) faces the end region.

According to certain embodiments, the second housing may include a speaker accommodation structure (e.g., the speaker accommodation structure 326 in FIG. 6) that surrounds the speaker module and faces the first housing.

According to certain embodiments, the electronic device may further include a processor (e.g., the processor 120 in FIG. 1) configured to adjust a signal generated by the speaker unit based on the sliding movement of the first housing.

According to certain embodiments of the disclosure, an electronic device (e.g., the electronic device 200 in FIG. 3) may include a first housing (e.g., the first housing 201 in FIG. 3), a second housing (e.g., the second housing 202 in FIG. 3) configured to accommodate at least a portion of the first housing and to guide the sliding movement of the first housing, a display (e.g., the display 203 in FIG. 3) including a first display region (e.g., the first display region A1 in FIG. 3) disposed on the first housing and a second display region (e.g., the second display region A2 in FIG. 3) extending from the first display region, a speaker module (e.g., the speaker module 440 in FIG. 9) including a speaker unit (e.g., the speaker unit 444 in FIG. 9) disposed within the second housing and a speaker frame (e.g., the speaker frame 442 in FIG. 9) configured to accommodate the speaker unit, a guide member (e.g., the guide member 460 in FIG. 9) at least a portion of which is positioned between the first housing and the second housing, and at least one protruding structure (e.g., the protruding structure 450 in FIG. 10) to seal the space between the first housing and the second housing and facing the guide member.

According to certain embodiments, the electronic device may further include a resonance space (e.g., the resonance space 404 in FIG. 9) at least a portion of which is surrounded by the first housing and the second housing, such that the resonance space is configured to change in size based on the sliding movement of the first housing.

According to certain embodiments, the second housing may include a $(2-1)^{th}$ side wall (e.g., the $(2-1)^{th}$ side wall 421 in FIG. 10), a $(2-2)^{th}$ side wall (e.g., the $(2-2)^{th}$ side wall 422 in FIG. 10) facing the $(2-1)^{th}$ side wall, a $(2-1)^{th}$ plate (e.g., the $(2-1)^{th}$ plate 423 in FIG. 10) configured to support the $(2-1)^{th}$ side wall and the $(2-2)^{th}$ side wall, and a $(2-2)^{th}$ plate (e.g., the $(2-2)^{th}$ plate 424 in FIG. 10) facing the $(2-1)^{th}$ plate, the guide member may be disposed on at least one of the $(2-1)^{th}$ side wall, the $(2-2)^{th}$ side wall, the $(2-1)^{th}$ plate, or the $(2-2)^{th}$ plate, and the at least one protruding structure may extend from the first housing, According to certain embodiments, the first housing may include a $(1-1)^{th}$ side wall (e.g., the $(1-1)^{th}$ side wall 411 in FIG. 10) facing the $(2-1)^{th}$ side wall, a $(1-2)^{th}$ side wall (e.g., the $(1-2)^{th}$ side wall 412 in FIG. 10) facing the $(2-2)^{th}$ side wall, a $(1-1)^{th}$ plate (e.g., the $(1-1)^{th}$ plate 413 in FIG. 10) facing the $(2-1)^{th}$ plate, and a $(1-2)^{th}$ plate (e.g., the $(1-2)^{th}$ plate 414 in FIG. 10) facing the $(2\text{-}2)^{th}$ plate, and the at least one protruding structure may include a first protruding structure (e.g., the first protruding structure 451 in FIG. 10) extending from the $(1\text{-}1)^{th}$ side wall, a second protruding structure (e.g., the second protruding structure 452 in FIG. 10) extending from the $(1\text{-}2)^{th}$ side wall, a third protruding structure (e.g., the third protruding structure 453 in FIG. 10) extending from the $(1\text{-}1)^{th}$ plate, and a fourth protruding structure (e.g., the fourth protruding structure 454 in FIG. 10) extending from the $(1\text{-}2)^{th}$ plate.

According to certain embodiments, the first housing may include a $(1\text{-}1)^{th}$ side wall (e.g., the $(1\text{-}1)^{th}$ side wall 411 in FIG. 10), a $(1\text{-}2)^{th}$ side wall (e.g., the $(1\text{-}2)^{th}$ side wall 412 in FIG. 10) facing the $(1\text{-}1)^{th}$ side wall, a $(1\text{-}1)^{th}$ plate (e.g., the $(1\text{-}1)^{th}$ plate 413 in FIG. 10) configured to support the $(1\text{-}1)^{th}$ side wall and the $(1\text{-}2)^{th}$ side wall, and a $(1\text{-}2)^{th}$ plate (e.g., the $(1\text{-}2)^{th}$ plate 414 in FIG. 10) facing the $(1\text{-}1)^{th}$ plate, and the guide member is disposed on at least one of the $(1\text{-}1)^{th}$ side wall, the $(1\text{-}2)^{th}$ side wall, the $(1\text{-}1)^{th}$ plate, or the $(1\text{-}2)^{th}$ plate, and the at least one protruding structure may extend from the second housing, According to certain embodiments, the second housing may include a $(2\text{-}1)^{th}$ side wall (e.g., the $(2\text{-}1)^{th}$ side wall 421 in FIG. 10), a $(2\text{-}2)^{th}$ side wall (e.g., the $(2\text{-}2)^{th}$ side wall 422 in FIG. 10) facing the $(2\text{-}1)^{th}$ side wall, a $(2\text{-}1)^{th}$ plate (e.g., the $(2\text{-}1)^{th}$ plate 423 in FIG. 10) configured to support the $(2\text{-}1)^{th}$ side wall and the $(2\text{-}2)^{th}$ side wall, and a $(2\text{-}2)^{th}$ plate (e.g., the $(2\text{-}2)^{th}$ plate 424 in FIG. 10) facing the $(2\text{-}1)^{th}$ plate, and the at least one protruding structure may include a first protruding structure extending from the $(2\text{-}1)^{th}$ side wall, a second protruding structure extending from the $(2\text{-}2)^{th}$ side wall, a third protruding structure extending from the $(2\text{-}1)^{th}$ plate, and a fourth protruding structure extending from the $(2\text{-}2)^{th}$ plate.

According to certain embodiments, the second housing may include at least one speaker hole (e.g., the speaker hole 627 in FIG. 13) configured to transmit sound generated by the speaker unit to the outside of the electronic device, and a $(2\text{-}1)^{th}$ side wall (e.g., the $(2\text{-}1)^{th}$ side wall 621 in FIG. 13) including a through-hole (e.g., the through hole 628 in FIG. 13) spaced apart from the at least one speaker hole, and the electronic device may further include a reflex port (e.g., the reflex port 670 in FIG. 13) configured to transmit a vibration generated by the speaker unit to the through hole facing the outside of the electronic device, such that the reflex port (e.g., the reflex port 670 in FIG. 13) is configured such that a length thereof is changed based on the sliding movement of the first housing.

According to certain embodiments, the reflex port may include a first port structure (e.g., the first port structure 672 in FIG. 13) connected to the second housing and facing at least a portion of the $(2\text{-}1)^{th}$ sidewall, and a second port structure (e.g., the second port structure 674 in FIG. 13) connected to the first housing and facing at least a portion of the first port structure.

According to certain embodiments, the electronic device may further include a processor (e.g., the processor 120 in FIG. 1) configured to adjust a signal generated by the speaker unit based on the sliding movement of the first housing.

It may be apparent to a person ordinarily skilled in the technical field to which the disclosure belongs that the above-described electronic device including various speaker modules according to the disclosure is not limited by the above-described embodiments and drawings, and can be variously substituted, modified, and changed within the disclosure.

The invention claimed is:

1. An electronic device, comprising:
a first housing;
a second housing configured to accommodate at least a portion of the first housing that faces a portion of the second housing and configured to guide a sliding movement of the first housing;
a display including a first display region disposed on the first housing, and a second display region extending from the first display region;
a speaker module disposed within the second housing;
a resonance space at least partially surrounded by the first housing and the second housing, the resonance space configured to be variable in size based on the sliding movement of the first housing; and
a roller structure disposed between the portion of the first housing and the portion of the second housing to seal the resonance space between the first housing and the second housing,
wherein the roller structure operatively connected to one of the first housing and the second housing and is configured to roll relative to the other of the first housing and the second housing during the sliding movement of the first housing,
wherein the other of the first housing and the second housing comprises a first side wall, a second side wall facing the first side wall, a first plate supporting the first side wall and the second side wall, and a second plate facing the first plate, and
wherein the roller structure includes a first roller structure configured to rotate relative to the first side wall, a second roller structure configured to rotate relative to the second side wall, a third roller structure configured to rotate relative to the first plate, and a fourth roller structure configured to rotate relative to the second plate.

2. The electronic device of claim 1, wherein the roller structure is operatively connected to the first housing, and configured to rotate relative to the second housing.

3. The electronic device of claim 2, wherein the portion of the second housing includes a $(2\text{-}1)^{th}$ side wall, a $(2\text{-}2)^{th}$ side wall facing the $(2\text{-}1)^{th}$ side wall, a $(2\text{-}1)^{th}$ plate supporting the $(2\text{-}1)^{th}$ side wall and the $(2\text{-}2)^{th}$ side wall, and a $(2\text{-}2)^{th}$ plate facing the $(2\text{-}1)^{th}$ plate, and
wherein the first roller structure is configured to rotate relative to the $(2\text{-}1)^{th}$ side wall, the second roller structure is configured to rotate relative to the $(2\text{-}2)^{th}$ side wall, the third roller structure is configured to rotate relative to the $(2\text{-}1)^{th}$ plate, and the fourth roller structure is configured to rotate relative to the $(2\text{-}2)^{th}$ plate.

4. The electronic device of claim 1, wherein the roller structure is operatively connected to the portion of the second housing, and configured to rotate relative to the first housing.

5. The electronic device of claim 4, wherein the portion of the second housing includes a $(2\text{-}1)^{th}$ side wall, a $(2\text{-}2)^{th}$ side wall facing the $(2\text{-}1)^{th}$ side wall, a $(2\text{-}1)^{th}$ plate supporting the $(2\text{-}1)^{th}$ side wall and the $(2\text{-}2)^{th}$ side wall, and a $(2\text{-}2)^{th}$ plate facing the $(2\text{-}1)^{th}$ plate, and
wherein the first roller structure is connected to the $(2\text{-}1)^{th}$ side wall, the second roller structure is connected to the $(2\text{-}2)^{th}$ side wall, the third roller structure is connected to the $(2\text{-}1)^{th}$ plate, and the fourth roller structure is connected to the $(2\text{-}2)^{th}$ plate.

6. The electronic device of claim 1, wherein the roller structure includes a substantially cylindrical central region operatively connected to the first housing, and a substantially conical end region extending from the central region.

7. The electronic device of claim 6, wherein the portion of the second housing includes and inclined structure configured to seal the resonance space defined between the first housing and the second housing together with the roller structure, wherein the second housing is oriented to face the end region.

8. The electronic device of claim 1, wherein the second housing includes a speaker accommodation structure surrounding the speaker module and oriented to face the first housing.

9. The electronic device of claim 1, further comprising a processor configured to adjust a signal generated by the speaker module, based on the sliding movement of the first housing.

10. An electronic device, comprising:
a first housing;
a second housing configured to accommodate at least a portion of the first housing, and to guide a sliding movement of the first housing;
a display including a first display region disposed on the first housing, and a second display region extending from the first display region;
a speaker module disposed inside the housing;
a guide member at least a portion of which is disposed between the first housing and the second housing;
at least one protruding structure sealing a space between the first housing and the second housing and facing the guide member; and
a resonance space at least partially surrounded by the first housing and the second housing, and configured to be variable in size based on the sliding movement of the first housing,
wherein the second housing includes a $(2\text{-}1)^{th}$ side wall, a $(2\text{-}2)^{th}$ side wall facing the $(2\text{-}1)^{th}$ side wall, a $(2\text{-}1)^{th}$ plate supporting the $(2\text{-}1)^{th}$ side wall and the $(2\text{-}2)^{th}$ side wall, and a $(2\text{-}2)^{th}$ plate facing the $(2\text{-}1)^{th}$ plate,
wherein the guide member is disposed on at least one of the $(2\text{-}1)^{th}$ side wall, the $(2\text{-}2)^{th}$ side wall, the $(2\text{-}1)^{th}$ plate, or the $(2\text{-}2)^{th}$ plate,
wherein the at least one protruding structure extends from the first housing,
wherein the first housing includes a $(1\text{-}1)^{th}$ side wall facing the $(2\text{-}1)^{th}$ side wall, a $(1\text{-}2)^{th}$ side wall facing the $(2\text{-}2)^{th}$ side wall, a $(1\text{-}1)^{th}$ plate facing the $(2\text{-}1)^{th}$ plate, and a $(1\text{-}2)^{th}$ plate facing the $(2\text{-}2)^{th}$ plate, and
wherein the at least one protruding structure includes a first protruding structure extending from the $(1\text{-}1)^{th}$ side wall, a second protruding structure extending from the $(1\text{-}2)^{th}$ side wall, a third protruding structure extending from the $(1\text{-}1)^{th}$ plate, and a fourth protruding structure extending from the $(1\text{-}2)^{th}$ plate.

11. The electronic device of claim 10, wherein the second housing includes at least one speaker hole configured to transmit a sound generated by the speaker module to an outside of the electronic device, and a $(2\text{-}1)^{th}$ side wall including a through hole spaced apart from the at least one speaker hole,
wherein the electronic device further comprises a reflex port configured to transmit a vibration generated by the speaker module to the through hole oriented facing an exterior of the electronic device, wherein the reflex port is configured such that a length of the reflex port is changeable based on the sliding movement of the first housing,
wherein the reflex port includes:
a first port structure operatively connected to the second housing and facing at least a portion of the $(2\text{-}1)^{th}$ side wall, and
a second port structure operatively connected to the first housing and facing at least a portion of the first port structure, and
wherein at least a portion of the first port structure is disposed between the $(2\text{-}1)^{th}$ side wall and the second port structure, and the first port structure includes a recess facing the resonance space of the electronic device.

12. Electronic device comprising:
a first housing;
a second housing configured to accommodate at least a portion of the first housing, and to guide a sliding movement of the first housing;
a display including a first display region disposed on the first housing, and a second display region extending from the first display region;
a speaker module disposed inside the housing;
a guide member at least a portion of which is disposed between the first housing and the second housing;
at least one protruding structure sealing a space between the first housing and the second housing and facing the guide member; and
a resonance space at least partially surrounded by the first housing and the second housing, and configured to be variable in size based on the sliding movement of the first housing,
wherein the first housing includes a $(1\text{-}1)^{th}$ side wall, a $(1\text{-}2)^{th}$ side wall facing the $(1\text{-}1)^{th}$ side wall, a $(1\text{-}1)^{th}$ plate supporting the $(1\text{-}1)^{th}$ side wall and the $(1\text{-}2)^{th}$ side wall, and a $(1\text{-}2)^{th}$ plate facing the $(1\text{-}1)^{th}$ plate,
wherein the guide member is disposed on at least one of the $(1\text{-}1)^{th}$ side wall, the $(1\text{-}2)^{th}$ side wall, the $(1\text{-}1)^{th}$ plate, or the $(1\text{-}2)^{th}$ plate, and
wherein the at least one protruding structure extends from the second housing.

13. The electronic device of claim 12, wherein the second housing includes a $(2\text{-}1)^{th}$ side wall, a $(2\text{-}2)^{th}$ side wall facing the $(2\text{-}1)^{th}$ side wall, a $(2\text{-}1)^{th}$ plate supporting the $(2\text{-}1)^{th}$ side wall and the $(2\text{-}2)^{th}$ side wall, and a $(2\text{-}2)^{th}$ plate facing the $(2\text{-}1)^{th}$ plate, and
wherein the at least one protruding structure includes a first protruding structure extending from the $(2\text{-}1)^{th}$ side wall, a second protruding structure extending from the $(2\text{-}2)^{th}$ side wall, and a third protruding structure extending from the $(2\text{-}1)^{th}$ plate, and a fourth protruding structure extending from the $(2\text{-}2)^{th}$ plate.

14. The electronic device of claim 12, wherein the second housing includes at least one speaker hole configured to transmit a sound generated by the speaker module to an outside of the electronic device, and a $(2\text{-}1)^{th}$ side wall including a through hole spaced apart from the at least one speaker hole,
wherein the electronic device further comprises a reflex port configured to transmit a vibration generated by the speaker module to the through hole oriented facing an exterior of the electronic device, wherein the reflex port is configured such that a length of the reflex port is changeable based on the sliding movement of the first housing,
wherein the reflex port includes:
a first port structure operatively connected to the second housing and facing at least a portion of the $(2\text{-}1)^{th}$ side wall, and a second port structure operatively connected to the first housing and facing at least a portion of the first port structure, and wherein at least a portion of the first port structure is disposed between the $(2\text{-}1)^{th}$ side wall and the second port structure, and the first port structure includes a recess facing the resonance space of the electronic device.

* * * * *